(12) United States Patent
Korenaga

(10) Patent No.: US 6,954,041 B2
(45) Date of Patent: Oct. 11, 2005

(54) SUPPORTING APPARATUS HAVING A PLURALITY OF MAGNETS THAT GENERATE A FLOATING FORCE AND METHOD, STAGE APPARATUS, AND EXPOSURE APPARATUS

(75) Inventor: Nobushige Korenaga, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 26 days.

(21) Appl. No.: 10/434,058

(22) Filed: May 9, 2003

(65) Prior Publication Data

US 2003/0217694 A1 Nov. 27, 2003

(30) Foreign Application Priority Data

May 27, 2002 (JP) ........................................ 2002-152598

(51) Int. Cl.[7] ........................ H02K 41/00; H01L 21/00
(52) U.S. Cl. ........................... 318/135; 310/12; 355/53; 355/72
(58) Field of Search ................................. 318/135, 574, 318/600, 625, 687; 310/12, 13, 14; 29/785; 414/935, 936; 355/53, 72

(56) References Cited

U.S. PATENT DOCUMENTS

| | | | |
|---|---|---|---|
| 3,747,998 A | 7/1973 | Klein et al. ................. 308/10 |
| 3,791,704 A | 2/1974 | Perper ........................ 308/10 |
| 4,684,315 A | 8/1987 | Sugishima et al. ......... 414/749 |
| 4,805,761 A | * 2/1989 | Totsch ........................ 198/619 |
| 5,017,819 A | 5/1991 | Patt et al. ................... 310/90.5 |
| 5,202,598 A | 4/1993 | Katsumata ................... 310/90.5 |
| 5,467,720 A | 11/1995 | Korenaga et al. ............. 108/20 |
| 5,684,856 A | 11/1997 | Itoh et al. .................... 378/34 |
| 5,831,362 A | * 11/1998 | Chu et al. ................... 310/90.5 |
| 5,841,250 A | 11/1998 | Korenaga et al. ........... 318/135 |
| 5,942,825 A | * 8/1999 | Lee ............................ 310/90.5 |
| 6,002,465 A | 12/1999 | Korenaga ..................... 355/53 |
| 6,037,680 A | 3/2000 | Korenaga et al. ............. 310/12 |
| 6,107,703 A | 8/2000 | Korenaga et al. ............. 310/12 |
| 6,128,069 A | 10/2000 | Korenaga ..................... 355/53 |
| 6,157,159 A | 12/2000 | Korenaga et al. ........... 318/649 |
| 6,172,738 B1 | 1/2001 | Korenaga et al. ............. 355/53 |
| 6,177,978 B1 | 1/2001 | Korenaga ..................... 355/53 |
| 6,218,751 B1 | * 4/2001 | Bohlin ....................... 310/90.5 |
| 6,265,793 B1 | 7/2001 | Korenaga ..................... 310/12 |
| 6,320,645 B1 | 11/2001 | Inoue et al. .................. 355/53 |
| 6,359,677 B2 | 3/2002 | Itoh et al. ..................... 355/53 |

(Continued)

FOREIGN PATENT DOCUMENTS

| | | |
|---|---|---|
| DE | 29 38 782 A1 | 4/1981 |
| EP | 1 168 084 A2 | 1/2002 |
| JP | 57-101558 | 6/1982 |

OTHER PUBLICATIONS

European Search Report dated Jan. 18, 2005, issued in corresponding European patent appln. No. 03 25 2944, forwarded in a Communication dated Jan. 18, 2005.

*Primary Examiner*—Darren Schuberg
*Assistant Examiner*—Judson H. Jones
(74) *Attorney, Agent, or Firm*—Fitzpatrick, Cella, Harper & Scinto

(57) ABSTRACT

Compatibility of a small spring constant and large supporting load is realized, so that a stable operation is assured even if a fine-movement linear motor fails. A supporting unit, having a plurality of magnets whose same poles are arranged facing each other, is adapted to support the self-weight of a top plate on which an object to be positioned is mounted, using a repulsive force in a direction orthogonal to the facing direction of the plurality of magnets. In a characteristic curve representing the relationship between the floating force and displacement in a floating direction, the tangent inclination when the object is at a first position in the floating direction is negative, and the relationship of floating force<the self-weight holds when the object is at a second position lower than the first position.

28 Claims, 17 Drawing Sheets

U.S. PATENT DOCUMENTS

| | | | |
|---|---|---|---|
| 6,414,742 B1 | 7/2002 | Korenaga et al. | 355/53 |
| 6,448,679 B1 * | 9/2002 | Imlach | 310/90.5 |
| 6,479,991 B1 | 11/2002 | Korenaga | 324/226 |
| 6,570,645 B2 | 5/2003 | Korenaga et al. | 355/75 |
| 6,784,581 B1 * | 8/2004 | Chen et al. | 310/90.5 |
| 6,833,643 B2 * | 12/2004 | Beyer et al. | 310/90.5 |
| 2001/0031191 A1 | 10/2001 | Korenaga | 414/200 |
| 2003/0007140 A1 | 1/2003 | Korenaga | 355/72 |
| 2003/0102723 A1 | 6/2003 | Korenaga | 310/12 |

* cited by examiner

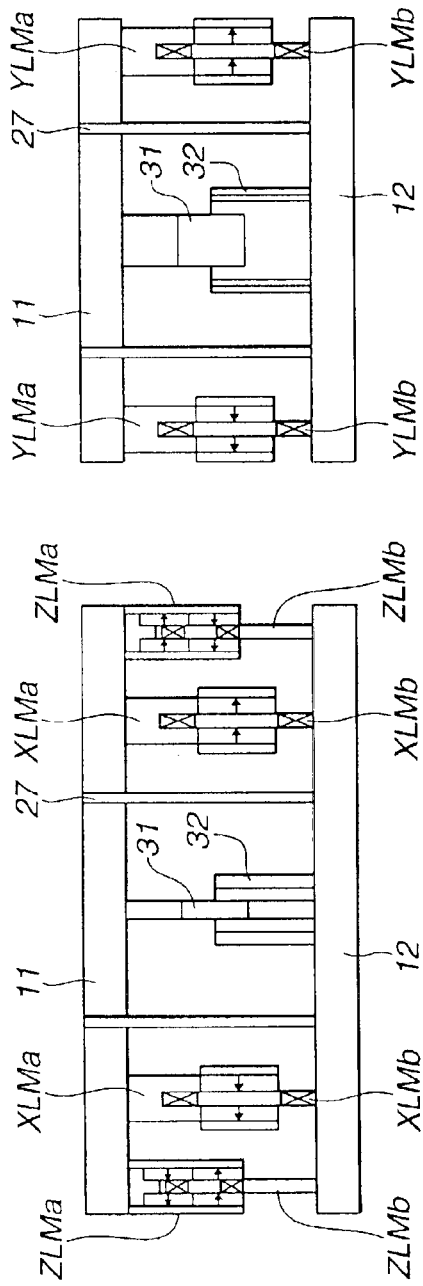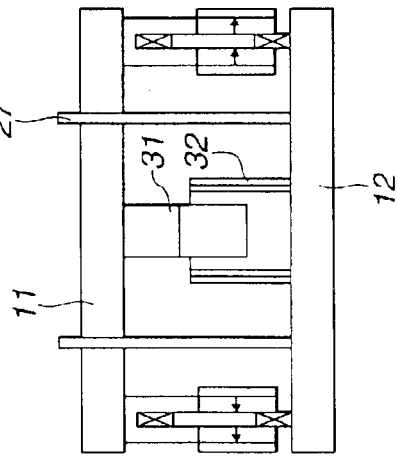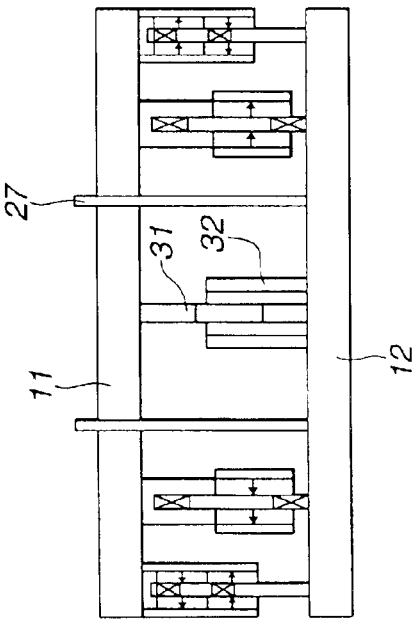

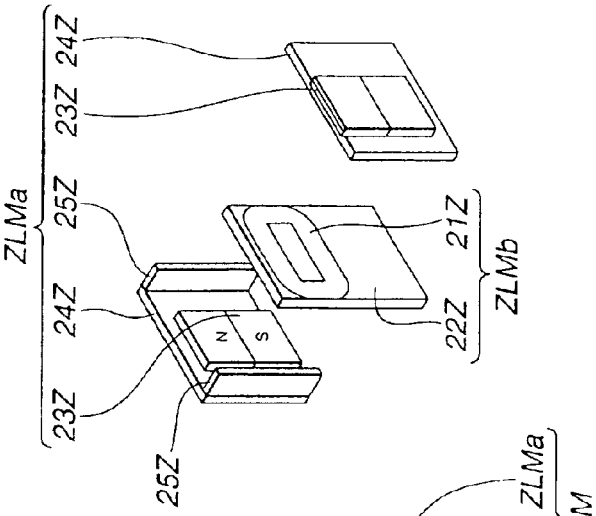
FIG.11A PRIOR ART
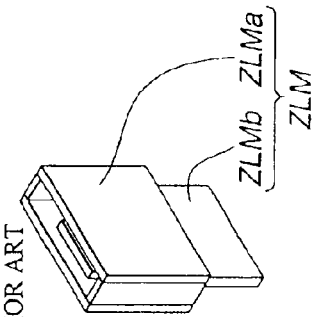
FIG.11B PRIOR ART
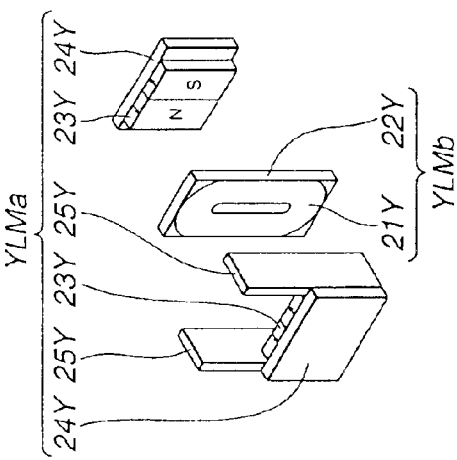
FIG.11C PRIOR ART
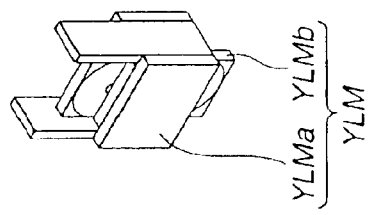
FIG.11D PRIOR ART
FIG.11E PRIOR ART
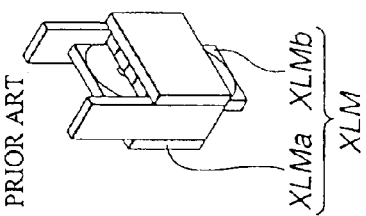
FIG.11F PRIOR ART

FIG.15

URL [http://www.maintain.co.jp/db/input.html]

TROUBLE DB INPUT PICTURE FRAME

DATE OF OCCURRENCE [2000/3/15] ~404
APPARATUS TYPE [**********] ~401
ITEM NAME [FAILURE IN OPERATION (ERROR AT START)] ~403
APPARATUS S/N [465NS4580001] ~402
URGENCY [D] ~405
SYMPTOM [THE LED CONTINUES TO FLASH AFTER TURNING ON THE POWER SUPPLY.] ~406
ACTION [RESTART THE POWER SUPPLY (DEPRESS THE RED BUTTON WHEN STARTING)] ~407
PROGRESS [A TENTATIVE ACTION DONE] ~408

[TRANSMIT] [RESET]

/410 LINK TO RESULT-SUMMARY DATA BASE
/411 SOFTWARE LIBRARY
/412 OPERATION GUIDE

SUPPORTING APPARATUS HAVING A PLURALITY OF MAGNETS THAT GENERATE A FLOATING FORCE AND METHOD, STAGE APPARATUS, AND EXPOSURE APPARATUS

BACKGROUND OF THE INVENTION

1. Field of the Invention

The present invention relates to a supporting apparatus and method, a stage apparatus using the same, and an exposure apparatus. The invention is suitable for self-weight compensation for a fine-movement stage, such as a wafer positioning stage apparatus of a semiconductor exposure apparatus, and more particularly, for self-weight compensation for a fine-movement stage in which six axes are subjected to direct positioning control by a linear motor.

2. Description of the Related Art

FIGS. 7A and 7B illustrate the detail of a wafer stage apparatus mounting a fine-movement stage in which six axes (six degrees of freedom) are subjected to direct positioning control by a linear motor, in a semiconductor exposure apparatus: FIG. 7A illustrates a state in which the apparatus is partially exploded; and FIG. 7B is a perspective view illustrating an assembled state of the apparatus.

In this wafer stage apparatus, a Y guide 2 is fixed on a base plate 1. A Y stage 3, guided by a side of the Y guide 2 and the upper surface of the base plate 1, is supported by an air slide (not shown) so as to be slidable in the y-axis direction on the base plate 1. The Y stage 3 principally includes four members, i.e., two X guides 4, a front-end member 5, and a rear-end member 6. The rear-end member 6 faces the side of the Y guide 2 and the upper surface of the base plate 1 via air pads (not shown) provided at a side and the lower surface of the rear-end member 6. The front-end member 5 faces the upper surface of the base plate 1 via an air pad (not shown) provided at the lower surface of the front-end member 5. As a result, as described above, the entirety of the Y stage 3 is supported so as to be slidable in the y-axis direction by the side of the Y guide 2 and the upper surface of the base plate 1.

On the other hand, an X stage 7, serving as a component of the Y stage 3, guided by the lower surfaces of the two X guides 4 and the upper surface of the base plate 1 is provided so as to surround the Y stage 3 around the x axis, and is supported so as to slidable in the x-axis direction by an air slide (not shown). The X stage 7 principally includes four members, i.e., two X-stage side plates 8, an upper plate 9, and a lower plate 10. The lower plate 10 faces the upper surface of the base plate 1 via an air pad (not shown) provided at the lower surface of the lower plate 10. The two X-stage side plates 8 face sides of the two X guides 4, serving as components of the Y stage 3, via air pads provided at sides of the X-stage side plates 8. The lower surface of the upper plate 9 and the upper surface of the X guide 4, and the upper surface of the lower plate 10 and the lower surface of the X guide 4 do not contact each other. As a result, as described above, the entire X stage 7 is supported so as to be slidable in the x-axis direction by the sides of the two X guides 4 and the upper surface of the base plate 1. In FIGS. 7A and 7B, there are also shown a front-side mounting plate 13, and a rear-side mounting plate 14.

One and two polyphase coil-switching-type linear motors X1, Y1, Y2 are used for x-axis-direction driving and y-axis-direction driving, respectively, as a driving mechanism. FIGS. 10A–10D are diagrams illustrating this driving mechanism: FIG. 10A is a plan view; FIG. 10B is a longitudinal cross-sectional view; FIG. 10C is a side view; and FIG. 10D is a plan view of a portion around a lower yoke. A stator is obtained by inserting a plurality of coils 16 arranged on a coil holder 15 that is long in the direction of the stroke, into a frame. A movable member comprises a box-shaped magnet unit in which movable magnets 18a and 18b are disposed at the inner surfaces of an upper yoke 17a and a lower yoke 17b connected by two side plates 19, respectively. This linear motor generates a thrust by selectively supplying a current to the coil 16 of the stator depending upon the position of the movable member.

FIG. 8 is an exploded perspective view illustrating the detail of the fine-movement stage. The fine-movement stage is provided on the upper plate 9 of the X stage 7, and positions a wafer, serving as an object to be positioned, in a z-tilt direction and a θ direction. Positioning is performed by moving a top plate 11 in the xy θ direction and in the z-tilt direction by driving three z-axis-direction fine-movement linear motors ZLM (each including a movable member ZLMa and a stator ZLMb), two x-axis-direction fine-movement linear motors XLM (each including a movable member XLMa and a stator XLMb), and two y-axis-direction fine-movement linear motors YLM (each including a movable member YLMa and a stator YLMb).

FIGS. 11A–11F illustrate the fine-movement linear motors. As shown in FIGS. 11A and 11B, the z-axis-direction fine-movement linear motor ZLM includes the movable member ZLMa and the stator ZLMb. The stator ZLMb includes a flat coil 21Z whose longer side is parallel to the horizontal line, and a coil holder 22Z for holding the flat coil 21Z. The coil holder 22Z is fixed to an intermediate plate 12, which is shown in FIG. 8.

The movable member ZLMa includes four magnets 23Z facing at a longer side of the flat coil 21Z via a gap, two yokes 24Z for circulating the magnetic fluxes of the magnets 23Z, and two side plates 25Z for connecting the two yokes 24Z. The movable member ZLMa is fixed to the top plate 11. In the z-axis-direction fine-movement linear motor ZLM, when a current is supplied to the flat coil 21Z, a force in the z-axis direction is applied between the flat coil 21Z and the magnetic yoke assembly.

As shown in FIGS. 11C and 11D, the y-axis-direction fine-movement linear motor YLM includes the movable member YLMa and the stator YLMb. The stator YLMb includes a flat coil 21Y whose longer side is parallel to the vertical line, and a coil holder 22Z for holding the flat coil 21Y. The coil holder 22Y is fixed to the intermediate plate 12.

The movable member YLMa includes four magnets 23Y facing at a longer side of the flat coil 21Y via a gap, two yokes 24Y for circulating the magnetic flux of the magnets 23Y, and two side plates 25Y for connecting the two yokes 24Y. The movable member YLMa is fixed to the top plate 11. In the y-axis-direction fine-movement linear motor YLM, the movable member YLMa and the stator YLMb are arranged so that the normal of the flat surface of the flat coil 21Y is directed in the x-axis direction, in order that, when a current is supplied to the flat coil 21Y, a force in the y-axis direction is applied between the flat coil 21Y and the magnetic yoke assembly.

As shown in FIGS. 11E and 11F, the x-axis-direction fine-movement linear motor XLM is entirely the same as the y-axis-direction fine-movement linear motor YLM, except that the mounting direction differs. The movable member XLMa and the stator XLMb are arranged so that the normal of the flat surface of the flat coil 21X is directed in the y-axis direction, in order that, when a current is supplied to the flat coil 21X, a force in the x-axis direction is applied between the flat coil 21X and the magnetic yoke assembly.

A square mirror (not shown) is formed at a side of the top plate 11, so that the positions of the top plate 11 in six-axes directions can be precisely measured by a laser interferometer.

In the above-described configuration, a wafer is first mounted on the top plate 11 by a conveying system (not shown). Then, the top plate 11 is precisely positioned in x, y, z, θ and tilt directions by performing appropriate current control for respective coils of an x-axis-direction coarse-movement linear motor X1, two y-axis-direction coarse-movement linear motors Y1 and Y2, the three z-axis-direction fine-movement linear motors ZLM, and a fine-movement motor θ, by a control system (not shown). Then, a pattern on an original (not shown) is successively exposed and transferred on the wafer by performing exposure using exposure means (not shown).

FIGS. 9A–9D illustrate a wafer mounting operation. FIGS. 9A and 9B illustrate the position of the fine-movement stage during exposure: FIG. 9A is a diagram as seen from the x-axis direction; and FIG. 9B is a diagram as seen from the y-axis direction. FIGS. 9C and 9D are diagrams illustrating the position of the fine-movement stage when the wafer is mounted: FIG. 9C is a diagram as seen from the x-axis direction; and FIG. 9D is a diagram as seen from the y-axis direction.

As can be understood from FIGS. 9C and 9D, when the wafer is mounted, the top plate 11 retracts in the lower z-axis direction. As a result, the upper end of an object temporary mounting member 27 (the object temporary mounting member being a wafer temporary mounting member in this case) fixed to the intermediate plate 12 is above relative to the top plate 11. At that time, the conveying system leaves after mounting the wafer on the object temporary mounting member 27. Then, the top plate 11 moves in the upper z-axis direction, and remounts the wafer from above the object temporary mounting member 27 onto the top plate 11.

The above-described linear motor utilizes the so-called Lorentz force. According to excellent control characteristics of the linear motor, a vibration insulating property that is a feature of the Lorentz force, and the configuration of the six-axes-control fine-movement stage in which a force is directly applied to the fine-movement top plate, serving as an object to be controlled, positioning accuracy is greatly improved as compared with a fine-movement stage in which a position is controlled via air and a mechanism.

However, the linear motor of this type has the problem that heat generation when supplying current is large. When only very precisely controlling the position of the top plate, heat generation causes no problem because the current is substantially zero. However, when supporting the self-weight of the top plate by the linear motor, large heat generation is produced because a large current continuously flows. Accordingly, appropriate self-weight supporting means is conventionally used for supporting the self-weight of the top plate.

More specifically, conventionally, a coil spring 28 is used as self-weight supporting means for the top plate. In order to prevent degradation of the vibration insulating property of the Lorentz-force-six-axes fine-movement stage, it is desirable to design the coil spring so as to have a spring constant as small as possible.

Furthermore, when delivering the wafer onto the object temporarily mounting member 27, the linear motor must generate a force corresponding to "the moving distance of the top plate in that operation X the spring constant". Heat generation increases in proportion to the square of the spring constant. It is also desirable to design the coil spring so as to have a small spring constant from this fact.

However, the conventional coil-spring-type self-weight support has the following problems.

One is a problem relating to a load when a small spring constant is provided. As the spring constant is selected to be smaller, the amount of deflection of the spring is larger for the same load. If the deflection is large, the top plate reaches the intermediate plate. In order to prevent the top plate from reaching the intermediate plate, the spring constant must be more or less large. As a result, vibration from the base plate is transmitted to the top plate, or heat generation when mounting the wafer is large.

Another problem is vibration of the spring itself when a small spring constant is provided.

SUMMARY OF THE INVENTION

In view of the foregoing, it is an object of the present invention to provide a supporting apparatus having a small spring constant and a large supporting load.

In one aspect, the present invention relates to a supporting apparatus including (a) a first movable member, and (b) a supporting unit having a plurality of magnets whose same poles are arranged to face each other, the supporting unit being configured to support the first movable member using a floating force generated by the plurality of magnets as a repulsive force in a floating direction perpendicular to a facing direction of facing of the plurality of magnets. Preferably, when the first movable member is set to a first position in the floating direction, an inclination of a tangent of a characteristic curve representing a relationship between the floating force and a displacement in the floating direction is negative.

In another aspect, the present invention relates to a supporting method comprising the steps of (a) providing a first movable member, (b) providing a plurality of magnets whose same poles are arranged to face each other, and (c) supporting the first movable member using a floating force generated by the plurality of magnets as a repulsive force in a floating direction perpendicular to a facing direction of the plurality of magnets.

In still another aspect, the present invention relates to a stage apparatus comprising (a) a top plate on which an object to be positioned is mountable, (b) a supporting apparatus as discussed above, which is configured to support the top plate, and (c) driving means for performing six-axes control of the top plate.

In a still further aspect, the present invention relates to a semiconductor-device manufacturing method comprising the steps of (a) installing, in a semiconductor manufacturing factory, a group of manufacturing apparatuses for performing semiconductor-device manufacturing processes, the group of semiconductor manufacturing apparatuses including an exposure apparatus comprising the above-described stage apparatus, and (b) manufacturing semiconductor devices by performing a plurality of semiconductor-device manufacturing processes using the group of manufacturing apparatuses.

In a still further aspect, the present invention relates to a semiconductor manufacturing factory comprising (a) a group of manufacturing apparatuses for performing a plurality of semiconductor manufacturing processes, the group of manufacturing apparatuses including an exposure apparatus as discussed above, (b) a local area network configured to interconnect the group of manufacturing apparatuses, and (c) a gateway configured to allow access from the local area network to an external network outside of the semiconductor manufacturing factory, wherein data communication of information relating to at least one of the group of manufacturing apparatuses is allowed in between the local area network and the external network outside of the semiconductor manufacturing factory via the gateway.

In a still further aspect, the present invention relates to a maintenance method comprising the steps of (a) providing a maintenance database connected to an external network outside of a semiconductor manufacturing factory by a vendor or a user of an exposure apparatus as discussed above installed in the semiconductor manufacturing factory, (b) allowing access to the maintenance database from within the semiconductor manufacturing factory via the external network, and (c) transmitting maintenance information stored in the maintenance database to the semiconductor manufacturing factory via the external network.

In a still further aspect, the present invention relates to an apparatus comprising (a) a plate arranged to support a wafer, upon which wafer a semiconductor manufacturing process is to be performed, and (b) a supporting device configured to support the plate, the supporting device comprising a movable magnet and a stator comprising a first stator magnet and a second stator magnet disposed on opposite sides of the movable magnet, each of the first stator magnet and the second stator magnet having a pole facing the movable magnet that is inverse to the respective facing pole of the movable magnet. The stator may further comprise a first yoke and a second yoke which together with the first stator magnet and the second stator magnet form a magnetic circuit.

The foregoing and other objects, advantages and features of the present invention will become more apparent from the following detailed description of the invention taken in conjunction with the accompanying drawings.

BRIEF DESCRIPTION OF THE DRAWINGS

FIGS. 3A–3D are diagrams illustrating operations of the supporting apparatus shown in FIG. 1;

FIGS. 11A–11F are diagrams illustrating a fine-movement linear motor of the conventional supporting apparatus;

FIG. 15 illustrates a specific example of a user interface; and

DETAILED DESCRIPTION OF THE INVENTION (First Embodiment)

Figure 1:
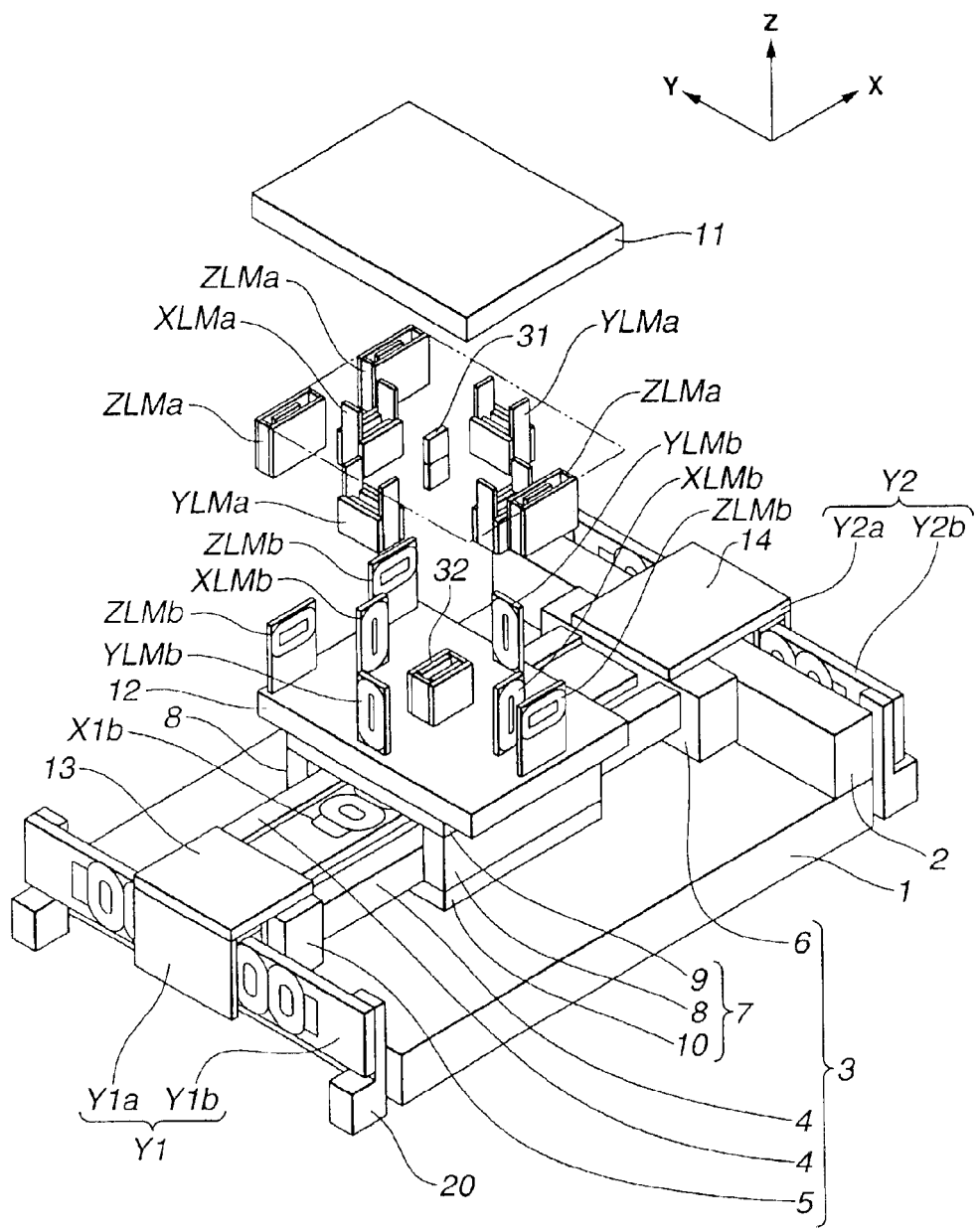
FIG. 1 is a perspective view illustrating a supporting apparatus according to a first embodiment of the present invention.
Figure 2A:
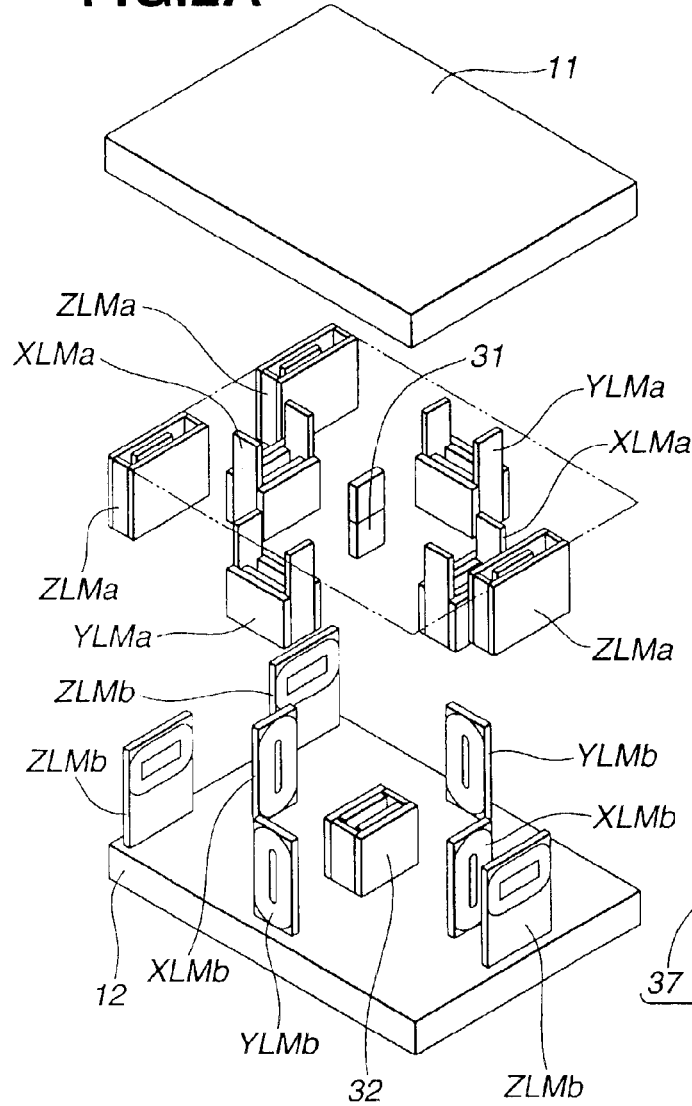
FIGS. 2A–2C are perspective views illustrating the details of the supporting apparatus shown in FIG. 1.
Figure 2B:
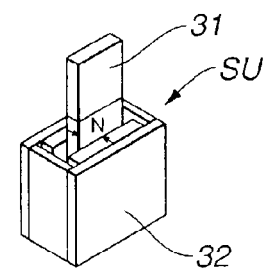
Figure 2C:
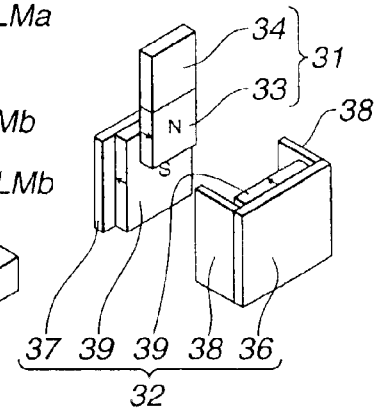

FIG. 1 is a perspective view illustrating a supporting apparatus according to a first embodiment of the present invention. FIGS. 2A–2C are perspective views illustrating the details of principal portions of the apparatus shown in FIG. 1.

Figure 7A:
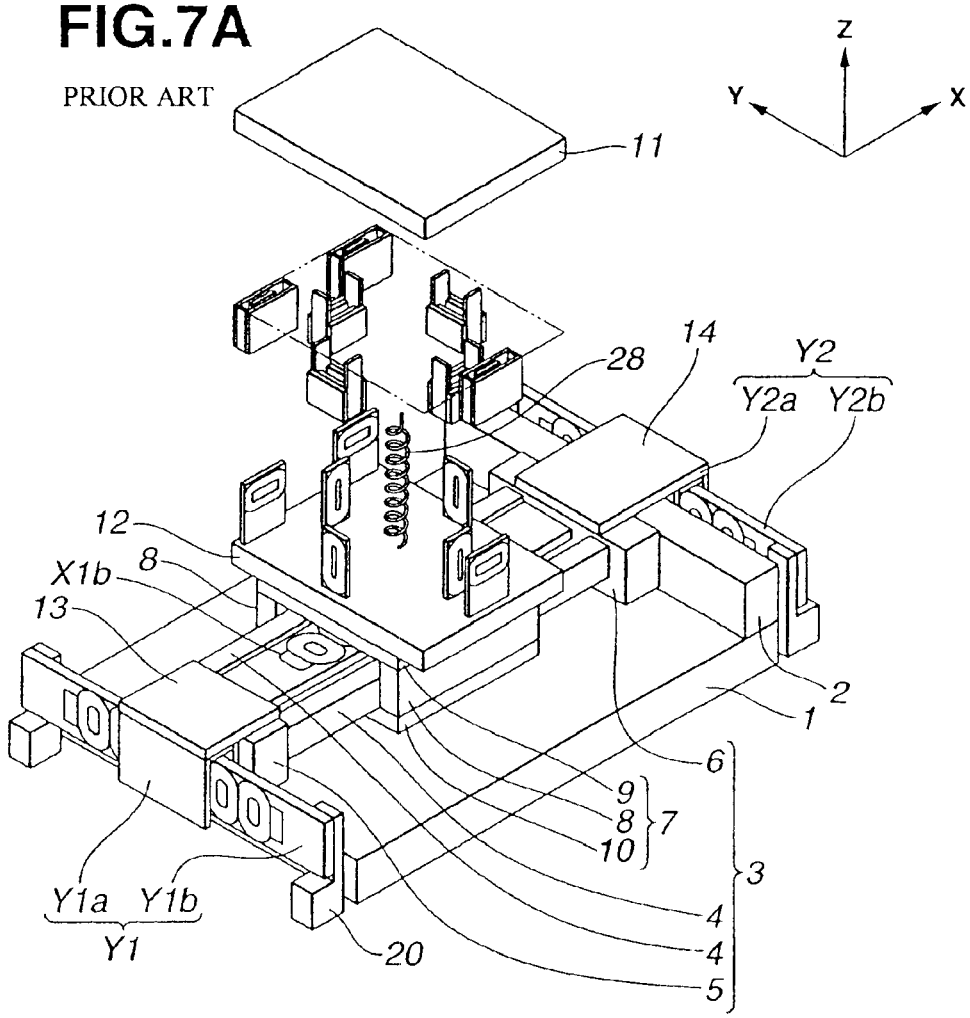
FIGS. 7A and 7B are perspective views illustrating the details of a conventional supporting apparatus.
Figure 7B:
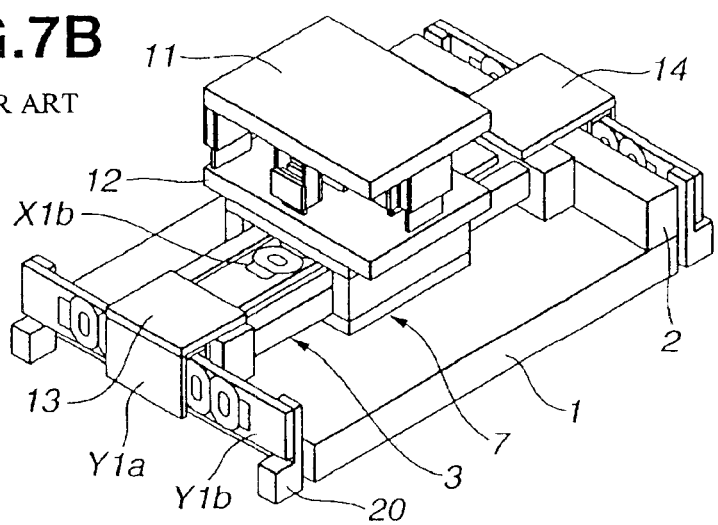
Figure 8:
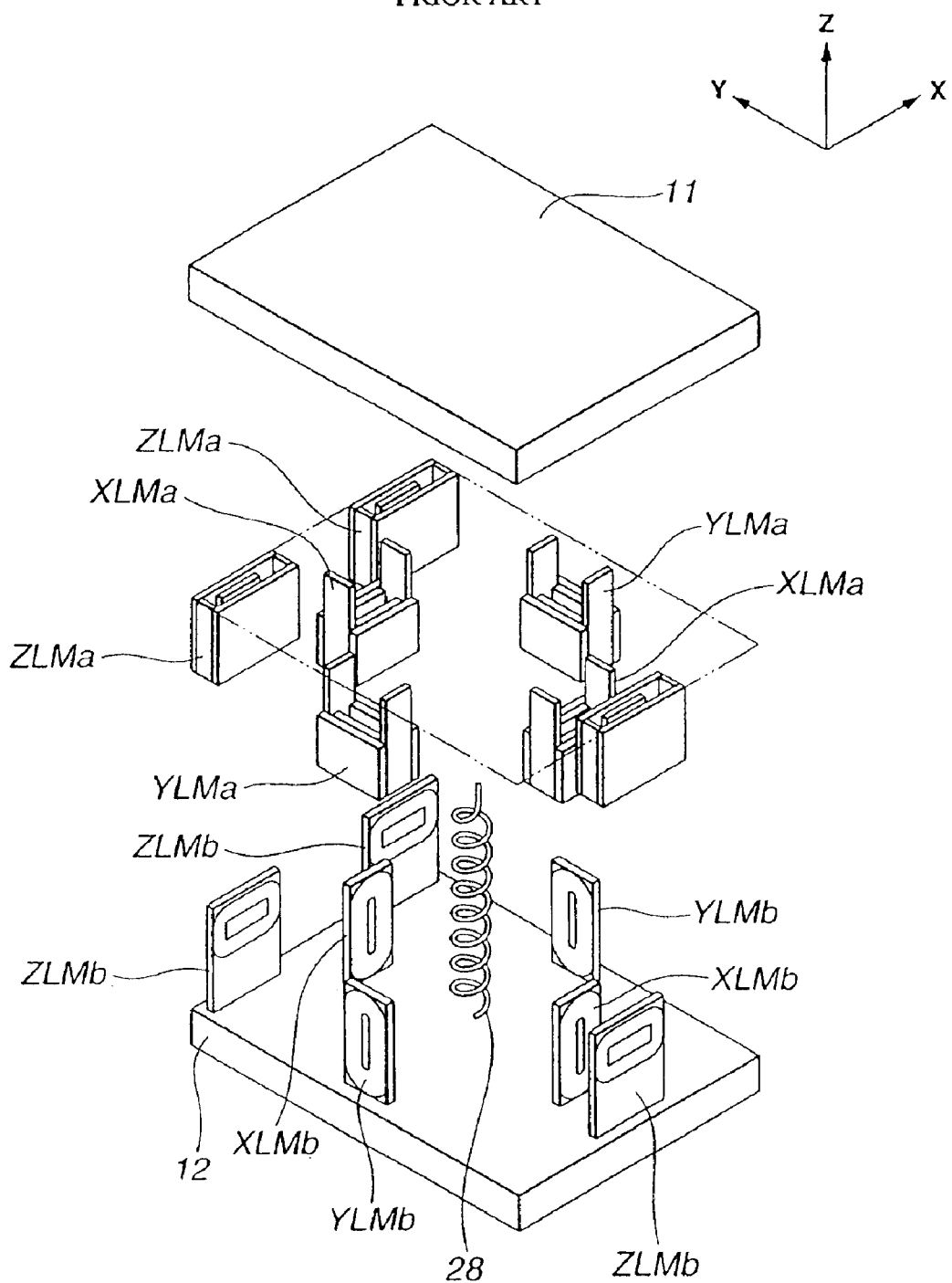
FIG. 8 is a perspective view illustrating the details of the conventional supporting apparatus.

Requirements in the configuration of components other than a supporting mechanism, and the supporting mechanism of this supporting apparatus are the same as in the above-described conventional apparatus. Accordingly, the same components as those described with reference to FIGS. 7A, 7B and 8 are indicated by the same reference numerals, and further description thereof will be omitted.

In this supporting apparatus, there is provided a repulsive supporting mechanism including a supporting unit SU shown in FIG. 2B that includes a repulsive movable member 31 and a repulsive stator 32, at a central portion of the detailed diagram of a six-axes fine-movement stage shown in FIG. 2A.

FIG. 2A is a perspective view illustrating the details of the supporting mechanism, and FIGS. 2B and 2C are perspective views illustrating the details of the supporting unit SU. The repulsive movable member 31 includes a repulsive movable magnet 33 and a repulsive-movable-magnet holder 34. The repulsive movable magnet 33 is a plate-shaped single-pole permanent magnet magnetized in the direction of the thickness of the plate. In FIGS. 2B and 2C, the direction of magnetization is indicated by a small arrow parallel to the y axis, and the front side is an N pole and the rear side is an S pole.

The repulsive stator 32 includes a front-side yoke 36, a rear-side yoke 37, two lateral yokes 38, and two repulsive fixed magnets 39. The repulsive fixed magnet 39 is bonded to each of the front-side yoke 36 and the rear-side yoke 37. The repulsive fixed magnet 39 is also a plate-shaped permanent magnet magnetized in the direction of the thickness, i.e., in a direction indicated by a small arrow parallel to the y axis in FIGS. 2B and 2C. However, the direction of poles is inverse to that of the repulsive movable magnet 33. That is, in FIGS. 2B and 2C, the front side is an S pole and the rear side of an N pole. The front-side yoke 36, the rear-side yoke 37, and the lateral yokes 38 are for circulating the magnetic fluxes of the repulsive fixed magnets 39, and are made of a soft magnetic material, such as iron or the like. The magnetic flux leaving from the rear side, i.e., from the N pole, of the repulsive fixed magnet 39 provided at the back of the front-side yoke 36 enters the front side, i.e., the S pole, of the repulsive fixed magnet 39 provided at the surface of the rear-side yoke 37 and the magnetic flux leaving from the rear side, i.e., from the N pole, of the repulsive fixed magnet 39, enters the rear-side yoke 37. These fluxes then enter the two lateral yokes 38 by separating in two directions (the positive and negative directions of the x axis in this case), enter the front-side yoke 36 after flowing in the positive direction of the y axis within the two lateral yokes 38, and reach the N pole of the repulsive fixed magnet 39 provided at the back of the front-side yoke 36 after flowing within the front-side yoke 36 toward the center of the yoke. That is, the supporting unit SU forms a magnetic circuit so as to circulate within a plane having a normal in the supporting direction. By thus forming the magnetic circuit and increasing the magnetic fluxes as compared with a case in which only the repulsive stator 32 is present, it is possible to increase the repulsive force when the repulsive movable magnet 33 faces the repulsive fixed magnets 39, as compared with a case in which the yoke member is made of a nonmagnetic material.

When using a spring as in the conventional approach as the supporting apparatus, resonance caused by the mass of the spring itself and the spring constant of the spring is also a problem. It is assumed that the natural frequency determined by the mass of the top plate and the spring constant of the spring is minimized in a restriction of supporting the top plate. However, a plurality of natural frequencies or resonance frequencies starting from several tens of Hz that are determined by the mass of the spring itself and the spring constant of the spring are present, and a vibration whose frequency coincides with one of the natural frequencies from among vibrations transmitted from the base plate is amplified due to resonance. As a result, the top plate is disturbed, resulting in degradation of positional accuracy.

In the configuration of the supporting unit SU in which a floating force is generated by repulsion between magnets as in the first embodiment, since an object corresponding to the mass of the spring itself as in the conventional approach is absent, the problem of resonance of the spring itself does not exist.

The distance between the two repulsive fixed magnets 39 is set so as to be larger than the thickness of the plate of the repulsive movable magnet 33, so that the repulsive movable magnet 33 can be inserted between the two repulsive fixed magnets 39 in a non-contact state. The repulsive movable magnet 33 is set so as to be inserted exactly at the central position between the two repulsive fixed magnets 39. In this configuration, when the repulsive movable member 31 is inserted in the repulsive stator 32, a repulsive force in the upward z-axis direction is exerted between the repulsive fixed magnets 39 and the repulsive movable magnet 33, because the same poles of the two magnets face each other. Although repulsive forces in the y-axis direction are exerted between the same poles of the two magnets, these repulsive forces are cancelled because the repulsive movable magnet 33 and the two repulsive fixed magnets 39 are arranged symmetrically in the y-axis direction.

Figure 4:
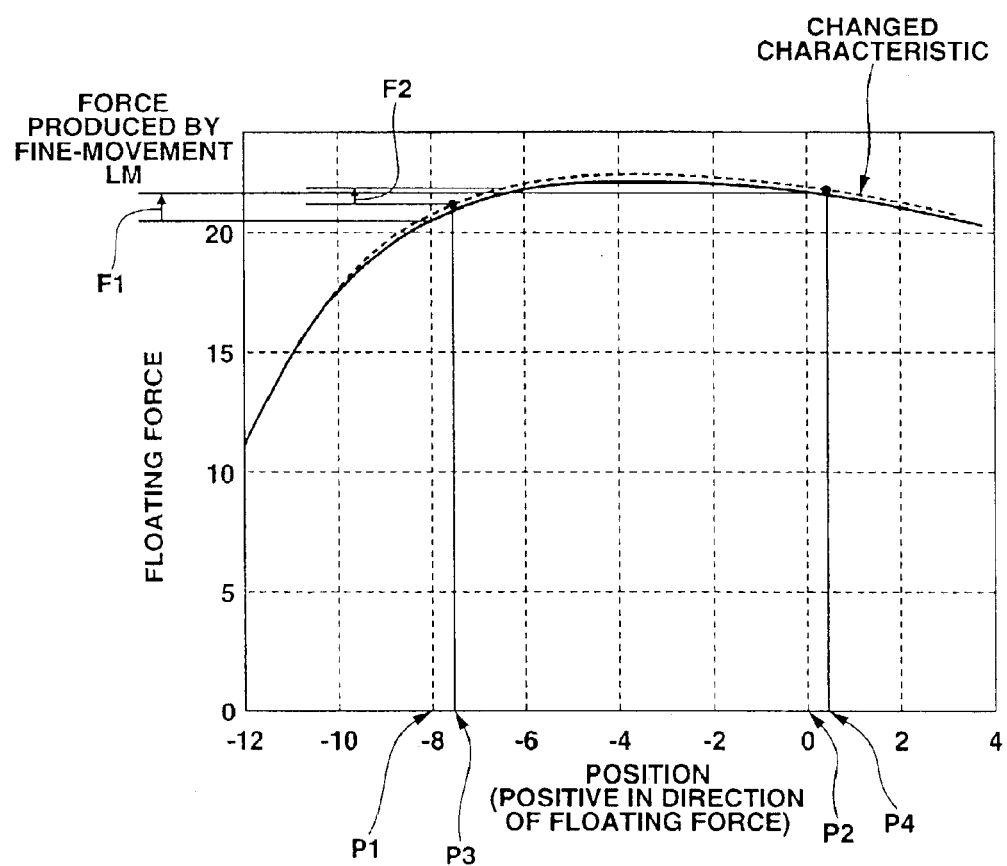
FIG. 4 is a graph illustrating a load displacement characteristic of a repulsive floating magnet of the supporting apparatus shown in FIG. 1.
Figure 5A:
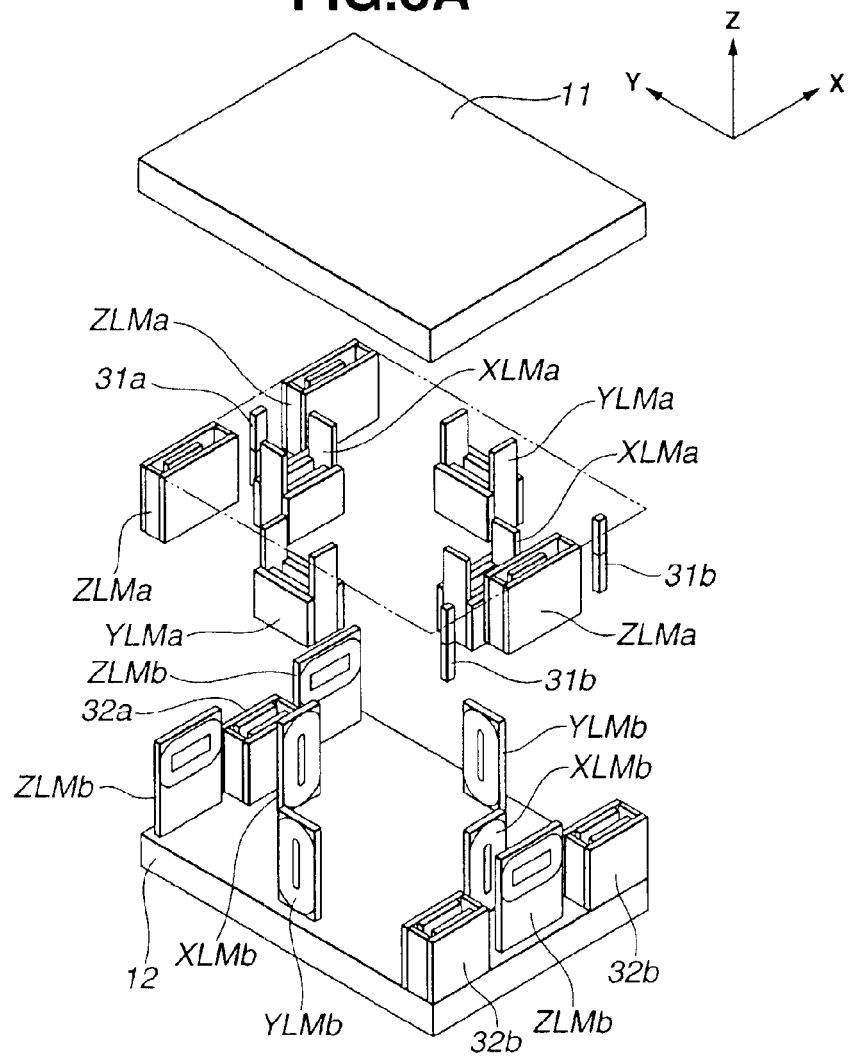
FIGS. 5A–5E are perspective views illustrating the details of a supporting apparatus according to a second embodiment of the present invention.
Figure 5B:
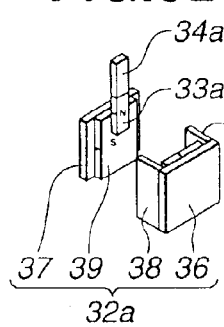
Figure 5C:
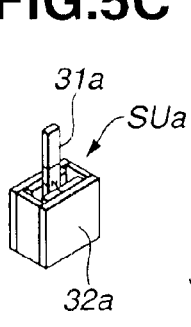
Figure 5D:
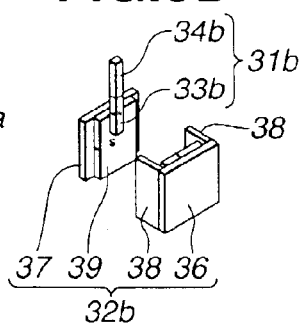
Figure 5E:
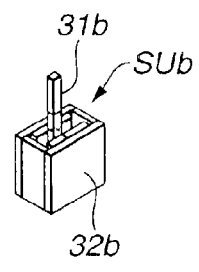

FIG. 4 illustrates the relationship between the position of the repulsive movable member 31 and the repulsive force. The mass of the top plate 11 is assumed to be 22 kg. The abscissa represents a direction parallel to the z axis, in which the z-axis direction of upward movement of the repulsive movable member 31 is made positive. The unit is mm. The ordinate represents the repulsive force, in units of kgf.

An exposure position P2, i.e., a state in which the self-weight of the top plate 11 balances with the repulsive force is made the position 0. A stroke for delivery for wafer exchange of about 8 mm is generally necessary. In FIG. 4, a position of −8 mm, i.e., a position where the repulsive movable magnet 33, or the top plate 11, is lowered by 8 mm in a z-axis direction from the exposure position is described as a delivery position P1.

In FIG. 4, the direction of the force and the direction of displacement are the same. Hence, if the inclination of the tangent is negative, it indicates a spring characteristic, i.e., a stable system, and if the inclination of the tangent is positive, it indicates an inverse spring characteristic, i.e., an unstable system. In FIG. 4, the inclination of the tangent is substantially zero at a position of −4 mm, negative at positions above −4 mm, i.e., at positions in the upper z-axis direction, and positive at positions more negative than −4 mm, i.e., at positions in the lower z-axis direction. The inclination of the tangent monotonically increases with respect to the abscissa.

As described in the conventional approach, there are two reasons for intending to reduce the spring constant in the supporting mechanism. One of the reasons is for insulating vibration from below. Another reason is for reducing variations in the floating force when the top plate 11 moves by the amount of a delivery stroke, i.e., for reducing the force generated by the fine-movement linear motor LM in a state of delivery.

From the view point of the first reason for insulating vibration, the exposure position P2 is preferably at a position of −4 mm. However, in consideration of heat generation during delivery, and safety when the fine-movement linear motor fails, the exposure position P2 is intentionally set to a position of 0 mm that is more positive than the position of −4 mm.

First, when the fine-movement linear motor LM fails at the exposure position P2, in order to hold the top plate 11 at that position, it is necessary to provide a spring system that is stable at that position. In order to satisfy this condition, it is only necessary to set the exposure position P2 to a more positive position than the position of −4 mm. The amount of the positive value may be set to a value as close to the value of −4 mm possible, estimating repulsive characteristics and a deviation of the mass of the top plate 11 from a designed value.

Figure 9A:
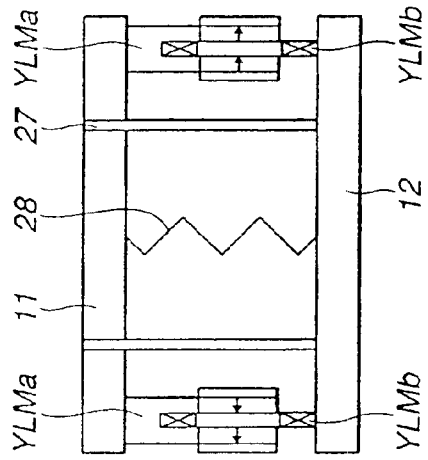
FIGS. 9A–9D are diagrams illustrating operations of the conventional supporting apparatus.
Figure 9B:
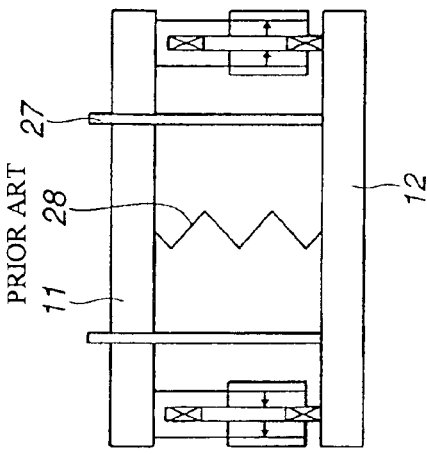
Figure 9C:
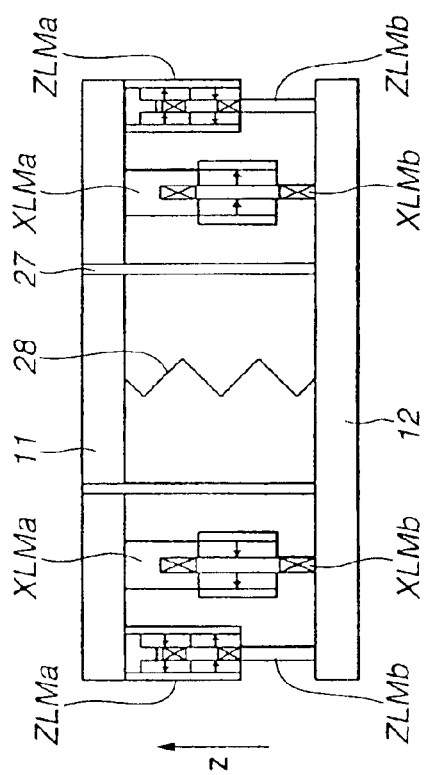
Figure 9D:
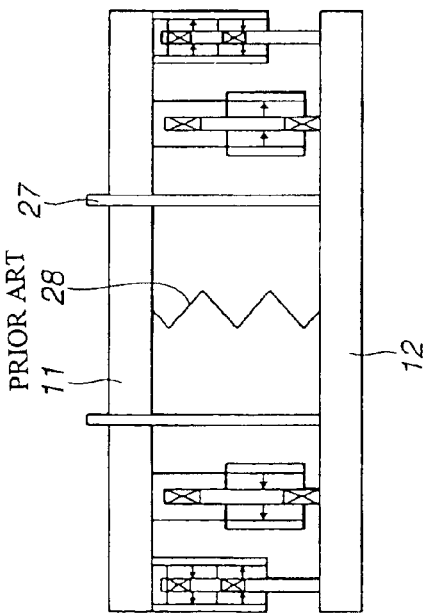
Figure 10A:
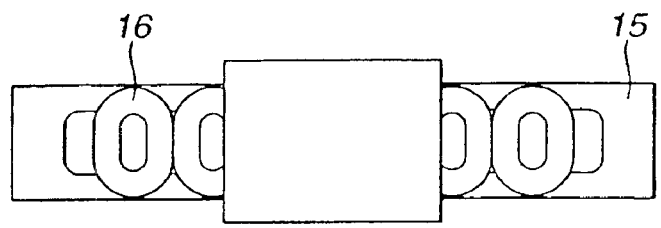
FIGS. 10A–10D are diagrams illustrating a linear motor of the conventional supporting apparatus.
Figure 10B:
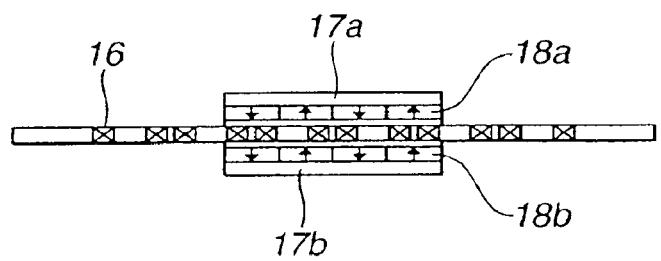
Figure 10C:
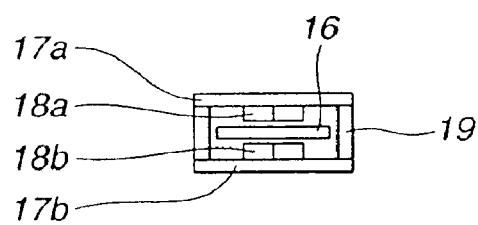
Figure 10D:
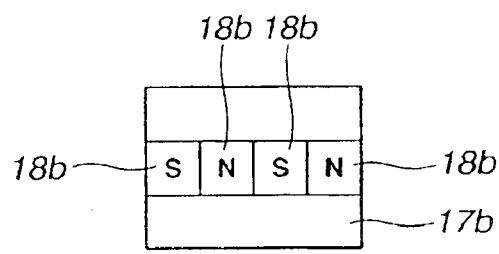

It is also designed that the top plate 11 must move downward when the fine-movement linear motor fails at the delivery position P1. The reason for such design will now be described in detail from the viewpoint of fail-safe during delivery in the conventional approach, again with reference to FIGS. 9A–9D. The state shown in FIGS. 9A and 9B is a state of exposure, in which the spring force generated by the coil spring 28 balances with the self-weight of the top plate 11. Since the spring 28 itself provides a stable system, a restoring force is exerted even if this state shifts, to try to maintain the state. Accordingly, even if at least one of the fine-movement linear motors XLM, YLM and ZLM fails, the top plate 11 substantially maintains the exposure position without moving upward or downward. The state shown in FIGS. 9C and 9D is a state of delivery, in which the force generated by the coil spring 28 > the self-weight of the top plate 11. The coil spring 28 generates a larger force than the self-weight of the top plate 11 by the amount of deflection. This amount of unbalance is cancelled as a whole by generation of a force by the fine-movement linear motor. If the fine-movement linear motor fails in this state, the top plate 11 is raised by being accelerated in the upward direction, because an upward force in total is produced by disappearance of the force generated by the fine-movement linear motor. At that time, the possibility that the conveying system is present above is high, thereby causing the problem that the top plate 11 collides with the conveying system, resulting in damage to both or one of the top plate 11 and the conveying system. When the linear motor fails at the delivery position, the top plate 11 desirably stops at that position or drops. When the top plate 11 drops, if a stopper having an attenuator is provided with a slight distance, the top plate 11 is not damaged because it is attenuated by the stopper.

For that purpose, it is necessary that the floating force < the self-weight of the top plate 11, at the delivery position. In the case shown in FIG. 4, the floating force=20.5 kgf at the delivery position P1, which is smaller than the self-weight of the top plate 11 of 1.5 kgf. This floating force is generated by the fine-movement linear motor. If the fine-movement linear motor fails in this state, the top plate 11 moves downward, because a downward force of 1.5 kgf is exerted. As this difference (F1) of 1.5 kgf becomes smaller, the force generated by the fine-movement linear motor is smaller, resulting in a decrease in heat generation. The difference is most preferably zero. However, since it is necessary to guarantee the magnitude relationship between the floating force and the self-weight of the top plate 11, the difference may be designed to be as small as possible provided that the magnitude relationship between the floating force and the self-weight of the top plate 11 is guaranteed, estimating deviations of the mass of the top plate 11 and the repulsive characteristic from designed values.

In order to increase or decrease the floating force, i.e., to shift the characteristic shown in FIG. 4 upward or downward, it is only necessary to change the dimensions of the supporting apparatus in the x-axis direction shown in FIGS. 2A–2C. If the measures (i.e., dimensions) of the repulsive movable magnet 33 and the repulsive fixed magnets 39 in the x-axis direction shown in FIG. 2C are doubled or halved, the floating force is substantially doubled or halved, respectively. As a whole, the characteristic shown in FIG. 4 is substantially proportional to the measurements in the x-axis direction. The important thing is the x-axis-direction measure of the repulsive movable magnet 33. If the x-axis-direction measures of the repulsive fixed magnet 39 and the yokes 36 and 37 are designed to be larger than the x-axis-direction measure of the repulsive movable magnet 33, the floating force is substantially proportional to the x-axis-direction measure of the repulsive movable magnet 33.

In consideration of the above-described circumstances, a change for reducing the force generated by the linear motor during delivery will now be studied. If the measures of the repulsive movable magnet 33 and the repulsive fixed magnets 39 in the x-axis direction in FIG. 2C are slightly increased, the curve indicating the relationship between "the z-axis-direction position and the floating characteristic" shown in FIG. 4 is slightly shifted upward in proportion to the measure of the repulsive fixed magnets 39 in the x-axis direction. The word "shift" does not indicate, of course, parallel movement, but indicates that a force proportionally changes at each position, as indicated by a broken line in FIG. 4. At that time, the exposure position, i.e., the position P2 where the self-weight of the top plate 11 balances with the floating force, becomes slightly positive with respect to 0. Since the delivery stroke of 8 mm is fixed, the delivery position moves to a position P3 that is slightly more positive. As a result, as shown in FIG. 4, the force (F2) generated by the fine-movement linear motor at the delivery position becomes smaller than the force (F1) before the change. At that time, since the exposure position has moved to a position P4 that is more positive compared with the position before the change, and the inclination of the tangent of the characteristic curve monotonically increases with respect to the abscissa, the spring constant increases from the time period before the change. That is, while heat generation during delivery decreases by this change, the vibration insulating property is degraded. These two factors are incompatible. However, as can be understood from FIG. 4, since a change in the spring constant due to shift of the exposure position is very small, i.e., the vibration insulating property does not change substantially, it can be considered that the above-described incompatibility substantially causes no problem.

The features of the first embodiment are as follows.

1) The exposure position P2 is set to a position where the inclination of the tangent of the curve indicating the relationship between "the position in the z-axis direction and the floating characteristic" changes from zero to a negative value. From the viewpoint of vibration insulation, the zero position is desirable. If heat generation from the linear motor for lowering the top plate during wafer delivery and problems during failure of the linear motor are mainly to be taken into consideration, a position where the inclination of the tangent is negative is desirable.

2) At the delivery position P1, the relationship of the floating force < the self-weight of the top plate is guaranteed. Furthermore, by estimating errors between designed values and actual values, it is designed so that the difference between the floating force and the self-weight of the top plate 11 is as small as possible. That is, the delivery position P1 is set to a position where the inclination of the tangent of the curve representing the relationship between "the position in the z-axis direction and the floating characteristic" is positive.

The natural frequency of the top plate 11 at the exposure position P2 before the change shown in FIG. 4 is about 1.8 Hz from the spring constant of about 4 kgf/14 mm=2,800 N/m, and the mass of 22 kg. This is a sufficient level as a vibration removing system.

Next, another role of the front-side yoke 36 and the rear-side yoke 37 will be described. As described above, the yokes are provided for circulating the magnetic fluxes of the repulsive fixed magnets 39 within a plane having a normal in the supporting direction. However, the front-side yoke 36 and the rear-side yoke 37 also have the role of improving the load displacement characteristic in the y-axis direction between the repulsive movable member 31 and the repulsive stator 32. Since the same poles of the repulsive movable magnet 33 and the repulsive fixed magnets 39 face each other, a repulsive force in the y-axis direction is exerted at each of the N pole side and the S pole side of the repulsive movable magnet 33.

These repulsive forces are cancelled because the directions of these forces are inverse, and therefore a force is not exerted in total, but the spring characteristic itself exists. That is, if the repulsive movable magnet 33 is shifted from the center between the two repulsive fixed magnets 39, a restoring force to return to the original state is exerted. This is undesirable because vibration in the y-axis direction is transmitted. On the other hand, an attracting force in the y-axis direction is exerted between the front-side yoke 36 and the corresponding repulsive fixed magnet 39, and also between the rear-side yoke 37 and the corresponding repulsive fixed magnet 39. Although these attracting forces are cancelled and therefore no force is exerted in total, an inverse spring characteristic exists. That is, if the repulsive movable magnet 33 is shifted from the center between the two repulsive fixed magnets 39, a force to further shift the repulsive movable magnet 33 is exerted. This inverse spring characteristic and the above-described spring characteristic between the repulsive movable magnet 33 and the two repulsive fixed magnets 39 cancel each other. As a result, the spring characteristic between the repulsive movable magnet 33 and the two repulsive fixed magnets 39 is mitigated. The degree of mitigation changes depending on the thickness of the front-side yoke 36 and the rear-side yoke 37. When the thickness is zero, the spring characteristic has a maximum value, and the inverse spring characteristic is, of course, zero. It is also known that if the thickness of the yokes is increased, the inverse spring characteristic becomes dominant, and there exists a thickness where an inverse spring characteristic is realized in total. That is, there exists an optimum thickness of the yokes. At that thickness, the spring characteristic of the repulsive movable magnet 33 and the repulsive fixed magnets 39 in the y-axis direction can be made substantially zero.

Next, the relationship between the x-axis-direction measurement of the repulsive movable magnet 33 and the x-axis-direction measurement of the repulsive fixed magnet 39 will be described. As shown in FIG. 2C, the x-axis-direction measurement of the repulsive fixed magnet 39 > the x-axis-direction measurement of the repulsive movable magnet 33. This is for improving the x-direction load displacement characteristic between the repulsive movable member 31 and the repulsive stator 32. It is designed so that the center of the repulsive movable magnet 33 coincides with the repulsive fixed magnets 39 in the x-axis direction. At this position, a force is not mutually exerted in the x-axis direction. If the center of the repulsive movable magnet 33 is shifted from this position in the x-axis direction, a force to further shift the center of the repulsive movable magnet 33 is basically exerted.

Stability may be controlled by the fine-movement linear motor. The problem is that a generated force changes depending on the position, and vibration in the x-axis direction from below is transmitted to the top plate 11. If the relationship of the x-axis-direction measurement of the repulsive movable member 31 < the x-axis-direction measurement of the repulsive stator 32 holds, a change in the magnetic field is mitigated even if the repulsive movable member 31 is shifted in the x-axis direction. Furthermore, if a sufficiently large difference is produced such that the x-axis-direction measurement of the repulsive movable member 31 << the x-axis-direction measurement of the repulsive stator 32, a change in the magnetic field becomes substantially zero even if the repulsive movable member 31 is shifted in the x-axis direction, so that a generated force can be substantially zero. Actually, if the repulsive fixed magnet 39 is designed so as to have allowances of about 8 mm at one side, and 16 mm at both sides with respect to the x-axis-direction measurement of the repulsive movable magnet 33, a change in the force can be considerably reduced with respect to a fine position deviation of the repulsive movable member 31. In order to deal with a case in which the linear motor stops its operation, a stopper having an attenuator may be provided in the x-axis direction.

In order to deal with only such an effect, the relationship of the x-axis-direction measurement of the repulsive fixed magnet 39 < the x-axis-direction measurement of the repulsive movable magnet 33 may be adopted. In such a case, however, for example, it is necessary to take into consideration an increase in the weight of the top plate 11, and make the x-axis-direction measurement of the yokes 36 and 37 larger than the x-axis-direction measurement of the repulsive movable magnet 33.

(Second Embodiment)

FIGS. 5A–5E are perspective views illustrating a supporting apparatus according to a second embodiment of the present invention. In the first embodiment, the self-weight is supported only at one point. In the second embodiment, however, the self-weight is supported at three points. The basic configuration of repulsive support is the same as in the first embodiment. The configuration of the second embodiment differs only in that support (or top plate 11) is performed at three points by supporting units, and the x-axis-direction measurement (i.e., size) of a repulsive movable member differs. A supporting unit SUa shown in FIGS. 5B and 5C includes a medium-size repulsive movable member 31a and a repulsive stator 32a at a rear portion in the x-axis direction. Each of two supporting units SUb shown in FIGS. 5D and 5E includes a small-size repulsive movable member 31b and a repulsive stator 32b at a front portion in the y-axis direction.

The x-axis-direction measurement of a medium-size repulsive movable magnet 33a is half of the measurement in the first embodiment, and the x-axis-direction measurement of a small-size repulsive movable magnet 33b is ¼ of the measurement in the first embodiment. That is, half of the self-weight of a top plate 11 is supported by the medium-size repulsive movable member 31a, and half of the self-weight of the top plate 11 is supported by the two small-size repulsive movable members 31b. Three repulsive stators 32a, 32b, and 32c are designed in the same manner as in the first embodiment. Accordingly, differences in the x-axis-direction measurements between the movable member and the stator are larger than in the first embodiment. Vibration transmission in the x-axis direction is mainly due to interaction between end portions of magnets. Accordingly, if three supporting members are provided, the amount of vibration transmission increases by three times. In order to mitigate such an increase, larger differences in the x-axis-direction measurement than in the first embodiment are provided.

Figure 6A:
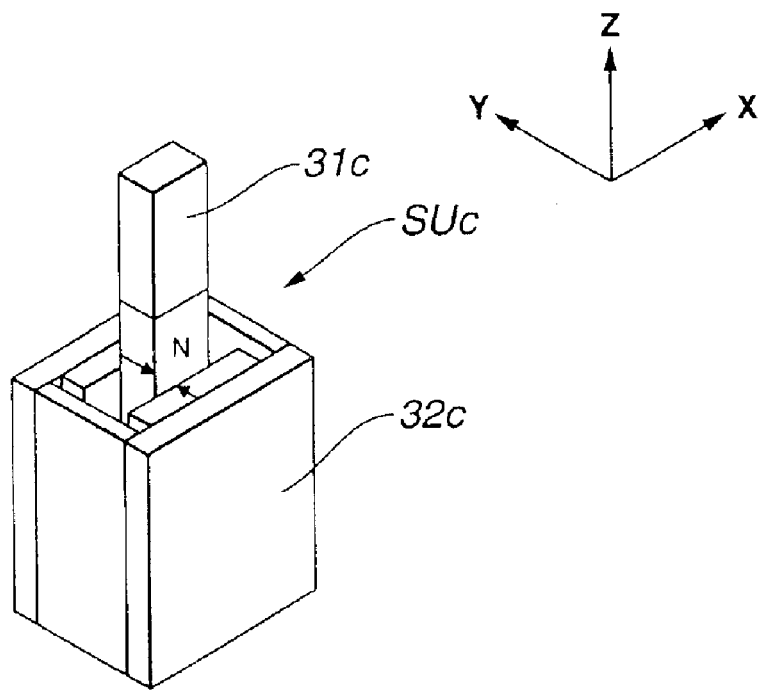
FIGS. 6A and 6B are perspective views illustrating a modification of a supporting unit according to the second embodiment.
Figure 6B:
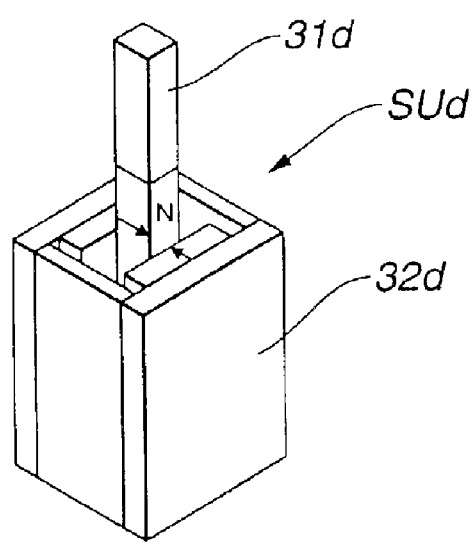

If the vibration suppression property of a servo system is sufficiently high, then, as in a modified example shown in FIGS. 6A and 6B, a medium-size supporting unit SUc may include a repulsive movable member 31c and a repulsive stator 32c, a small-size supporting unit SUd may include a repulsive movable member 31d and a repulsive stator 32d, and the difference in the x-axis-direction measurements between the medium-size supporting unit SUc and the small-size supporting unit SUd may be similar to the difference in the first embodiment. According to such a configuration, stability of the posture when the fine-movement linear motor fails is improved, and the amount of inclination becomes small.

(Third Embodiment)

Although in the first and second embodiments, cases in which the direction of magnetization of magnets is made parallel to the y-axis direction have been illustrated, these are only examples. The direction of magnetization may be parallel to the x-axis direction, or an arbitrary direction.

Although in the second embodiment, the direction of magnetization is made parallel to the y-axis direction in all of the three units, the direction of magnetization need not be the same for all of the three units. For example, only the pair of the medium-size repulsive movable member and the repulsive stator may be rotated by 90 degrees, so that the direction of magnetization is parallel to the x axis. According to such a configuration, the load displacement characteristic in the xy direction can be improved on the whole. That is, in the unit of the medium-size repulsive movable member, a weak spring property is provided in the x-axis direction, and a weak inverse spring property is provided in the y-axis direction. On the other hand, in the unit of the small-size repulsive movable member, a weak inverse spring property is provided in the x-axis direction, and a weak spring property is provided in the y-axis direction. Accordingly, on the whole, the spring property and the inverse spring property are reduced in both of the x-axis direction and the y-axis direction, and therefore a system in which vibration is hardly transmitted can be provided.

According to the above-described embodiments, disturbance in the θ direction of the Z tilt θ fine-movement stage decreases, and position accuracy in the θ direction is improved. Furthermore, by providing the conditions that, in the characteristic curve representing the relationship between the floating force and displacement in the floating direction, the inclination of the tangent at a predetermined position where processing for an object to be positioned is performed is negative, and the relationship of the floating force < the self-weight of the top plate holds at the delivery position of the object, a safe operation is assured because the top plate always moves downward when the fine-movement linear motor fails. By providing a yoke at the back of the magnet of the repulsive stator, or by providing the condition of the x-axis-direction measurement of the magnet at the top plate side < the x-axis-direction measurement of the magnet at the fixed side, the load displacement characteristic between the repulsive movable member and the repulsive stator in the x-axis direction can be improved. By providing a plurality of supporting units, stability of the posture when the fine-movement linear motor fails is improved, and the amount of inclination becomes small. By changing the direction of magnetization with respect to the apparatus among a plurality of supporting units, it is possible to improve the load displacement characteristic in the xy direction, and therefore to provide a system in which vibration is hardly transmitted.

(Fourth Embodiment)

Figure 12:
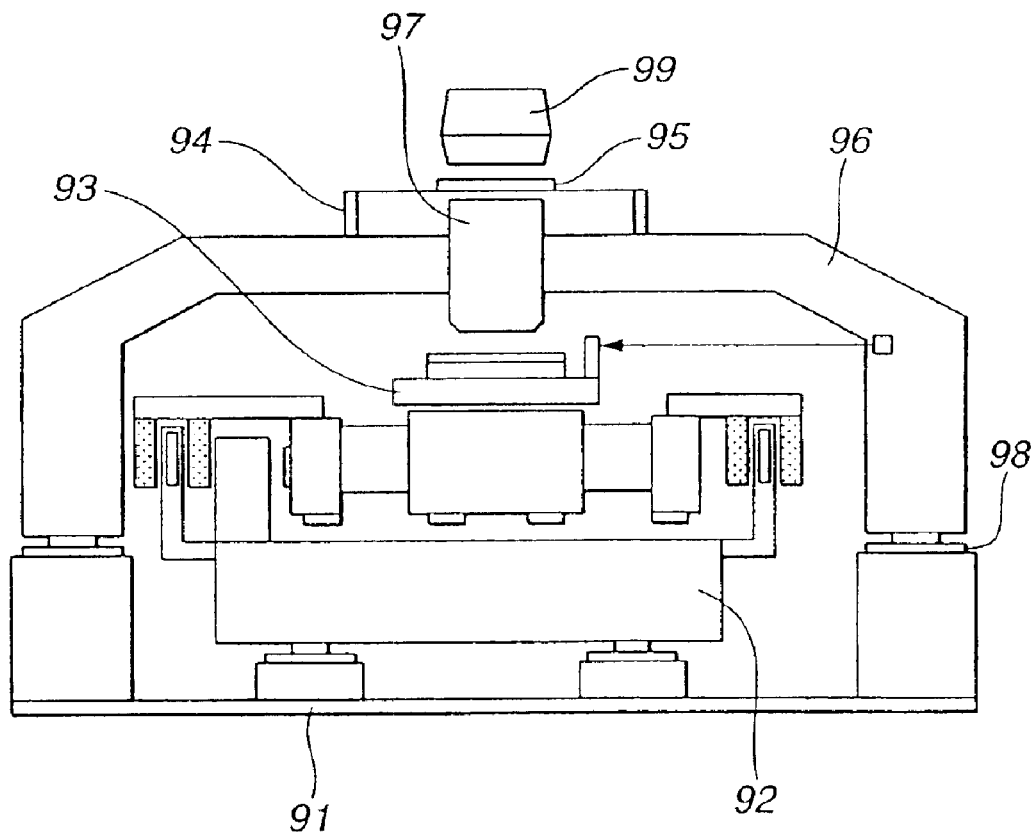
FIG. 12 is an elevation illustrating an exposure apparatus according to another embodiment of the present invention.

Next, a description will be provided of a scanning exposure apparatus mounting a stage apparatus having the supporting apparatus according to one of the above-described embodiments as a wafer stage, with reference to FIG. 12.

In FIG. 12, a barrel-shaped surface plate 96 is supported on a floor or a base plate 91 via dampers 98. The barrel-shaped surface plate 96 supports a reticle-stage surface plate 94, and a projection optical system 97 positioned between the reticle stage 95 and a wafer stage 93.

The wafer stage 93 is supported on a stage surface plate 92 that is supported on the floor or the base plate 91, and mounts and positions a wafer. The reticle stage 95 is supported on the reticle-stage surface plate 94 that is supported on the barrel-shaped surface plate 96, and can move while mounting a reticle on which a circuit pattern is formed. Exposure light for exposing the reticle mounted on the reticle stage 95 onto the wafer on the wafer stage 93 is generated from an illuminating optical system 99.

The wafer stage 93 is scanned in synchronization with the reticle stage 95. During scanning of the reticle stage 95 and the wafer stage 93, the positions of the two stages are continuously detected by respective interferometers, and are subjected to feedback to respective driving units of the reticle stage 95 and the wafer stage 93. It is thereby possible to exactly synchronize the scanning start positions of the two stages, and very precisely control the scanning speed at a constant-speed scanning region. While performing scanning of the two reticles by the projection optical system 97, the reticle pattern is exposed onto the wafer, and the circuit pattern is transferred.

In the fourth embodiment, the stage apparatus having the supporting apparatus according to one of the above-described embodiments is used as the wafer stage 93. Accordingly, even if the fine-movement linear motor fails, it is possible to perform a safe operation, and perform high-speed and high-precision exposure.

(Embodiment of a Semiconductor Production System)

Next, a description will be provided of a semiconductor-device (semiconductor chips such as ICs (integrated circuits), LSIs (large-scale integrated circuits) or the like, liquid-crystal panels, CCDs (charge coupled devices), thin-film magnetic heads, micromachines, and the like) production system that uses an apparatus according to the present invention. In this system, maintenance services, such as troubleshooting, periodic maintenance, software supply and the like, for manufacturing apparatuses installed in a semiconductor manufacturing factory are performed utilizing a computer network outside of the manufacturing factory.

Figure 13:
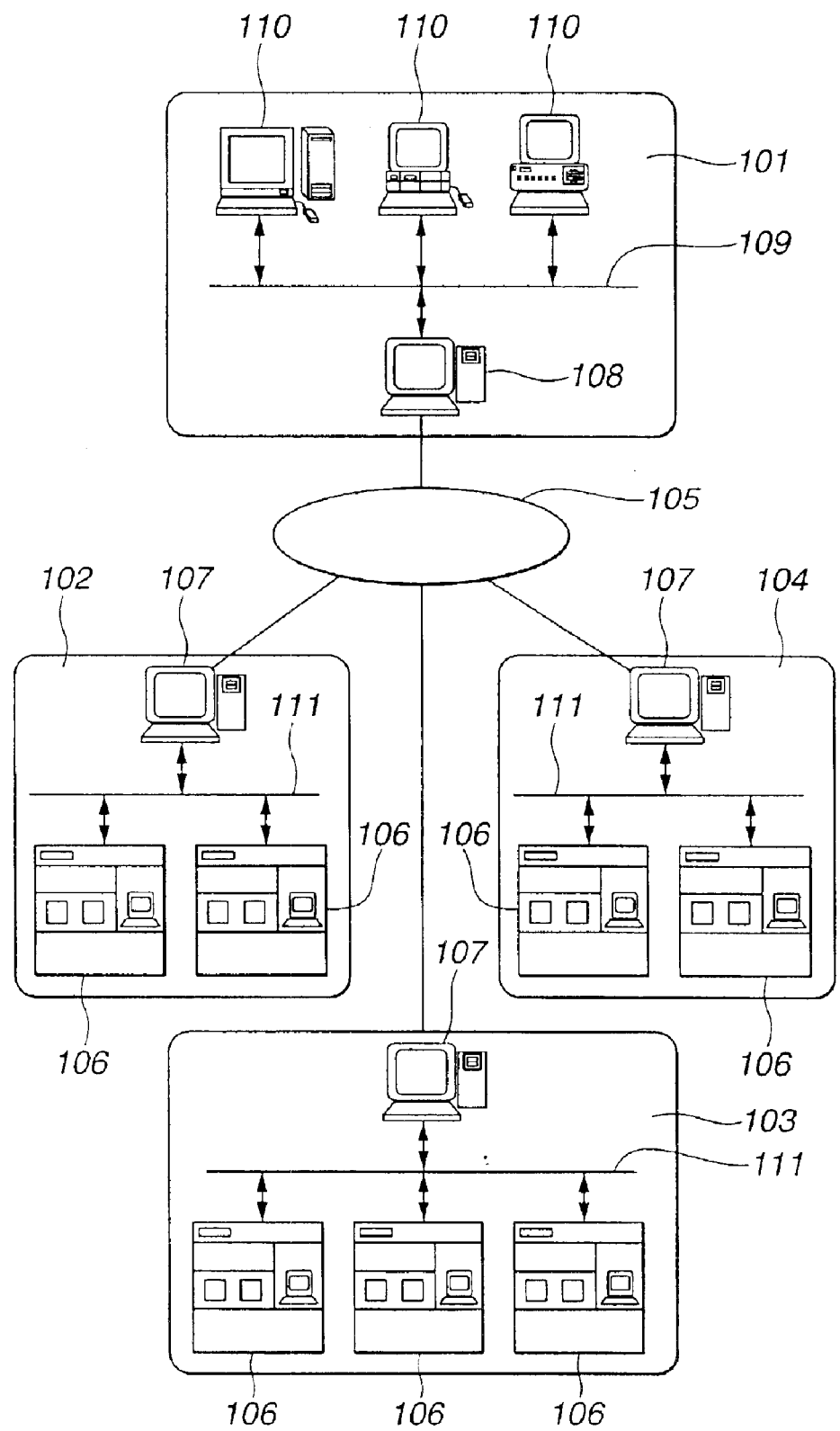
FIG. 13 is a schematic diagram illustrating a semiconductor-device manufacturing system using apparatuses of the invention, as seen from a certain angle.

FIG. 13 illustrates the entire system as seen from a certain angle. In FIG. 13, reference numeral 101 represents a business center of a vendor (apparatus supply maker) that provides semiconductor-device manufacturing apparatuses. Such manufacturing apparatuses include semiconductor manufacturing apparatuses for various processes used in each semiconductor manufacturing factory, such as apparatuses for pre-processes (lithography apparatuses, such as exposure apparatuses, resist process apparatuses, etching apparatuses and the like, heat-treatment apparatuses, film forming apparatuses, flattening apparatuses, and the like), and apparatuses for post-processes (assembly apparatuses, inspection apparatuses, and the like). Within the business center 101, there are provided a host management system 108 for supplying a maintenance database for the manufacturing apparatuses, a plurality of operation terminal computers 110, and a local area network (LAN) 109 for constructing an intranet or the like by interconnecting these apparatuses. The host management system 108 includes a gateway for connecting the LAN 109 to the Internet 105, serving as an external network for the business center, and a security function for limiting accesses from external locations.

There are also shown manufacturing factories 102–104 of a semiconductor maker, serving as a user of the manufacturing apparatuses. The manufacturing factories 102–104 may be factories that belong to different makers, or factories that belong to the same maker (for example, a factory for pre-processes, a factory for post-process, and the like). Within each of the factories 102–104, there are provided a plurality of manufacturing apparatuses 106, a LAN 111 for constructing an intranet or the like by interconnecting these apparatuses, and a host management system 107, serving as a monitoring apparatus for monitoring the state of operations of each of the manufacturing apparatuses 106. The host management system 107 provided in each of the factories 102–104 includes a gateway for connecting the LAN 111 in each factory to the Internet 105, serving as an external network of the factory. According to this configuration, it is possible to access the host management system 108 at the vendor's business center 101 from the LAN 111 of each factory via the Internet 105, and only access to limited users is allowed by a security function of the host management system 108. More specifically, status information (for example, the symptom of a manufacturing apparatus in trouble) indicating the operation status of each of the manufacturing apparatuses 106 is notified from the factory to the vendor, and response information (for example, information instructing an action for a trouble, and software and data for the action) corresponding to the notification, and maintenance information including latest software, help information and the like can be received from the vendor side. A communication protocol (TCP/IP (Transmission Control Protocol/Internet Protocol) generally used in the Internet is used for data communication between each of the factories 102–104 and the vendor business center 101 and data communication at the LAN 111 in each factory. Instead of utilizing the Internet as an external network outside of the factory, a dedicated network (ISDN (Integrated Services Digital Network) or the like) having high security that cannot be accessed by a third party may also be utilized. The host management system 107 is not necessarily provided by the vendor. For example, the user may construct a database and provide it on an external network, and permit access to the database from a plurality of factories of the user.

Figure 14:
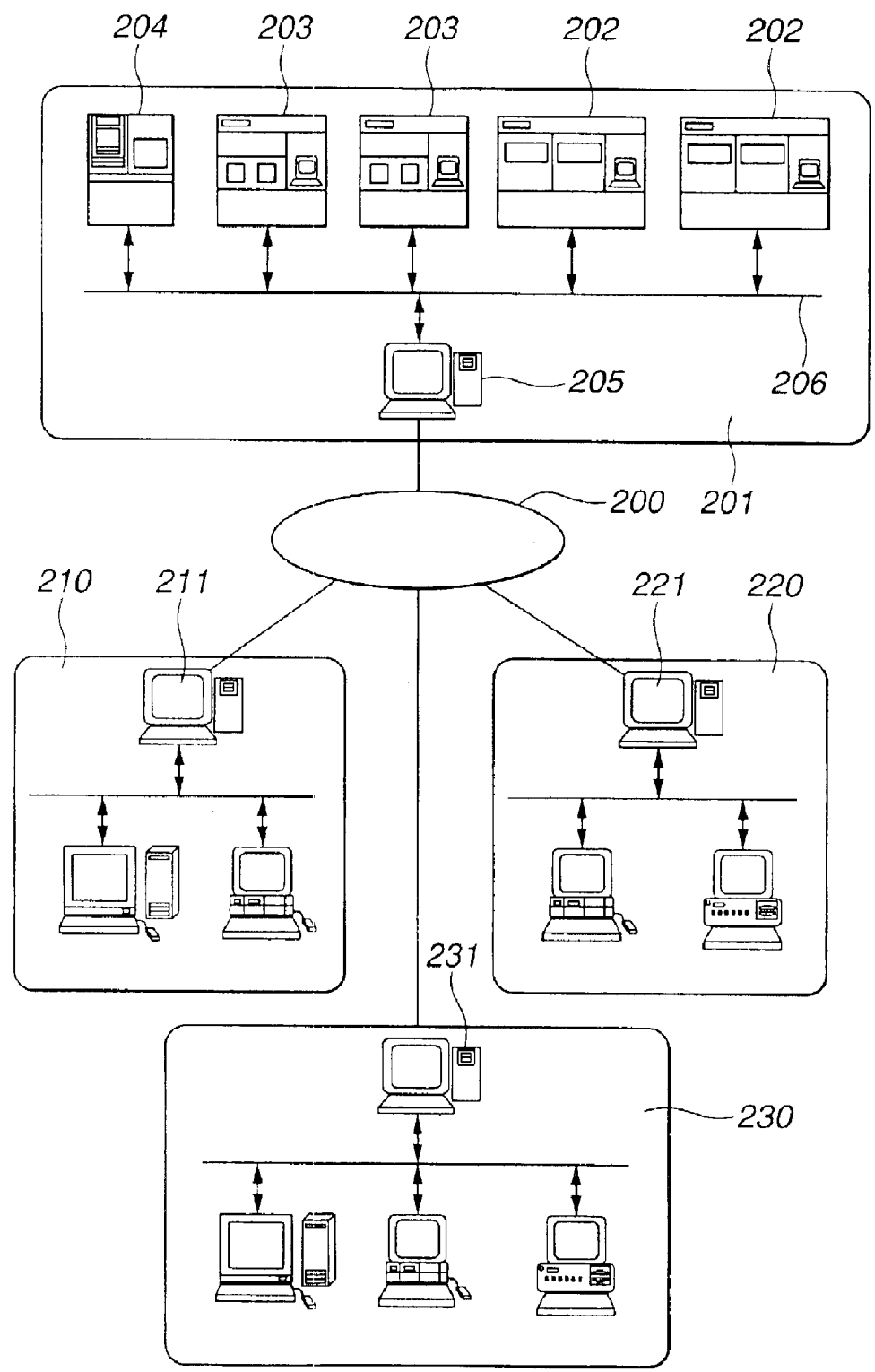
FIG. 14 is a schematic diagram illustrating the semiconductor-device manufacturing system, as seen from another angle.

FIG. 14 is a schematic diagram illustrating the entire system of the embodiment as seen from an angle different from the angle in FIG. 13. In the case shown in FIG. 13, a plurality of user factories, each including manufacturing apparatuses and a management system of the vendor of the manufacturing apparatuses are interconnected by an external network, and production management at each factory and information relating to at least one of the manufacturing apparatuses are subjected to data communication. In the case shown in FIG. 14, a factory including manufacturing apparatuses of a plurality of vendors and a management system of each of the vendors are interconnected by an external network outside of the factory, and maintenance information of the respective manufacturing apparatuses is subjected to data communication. In FIG. 14, reference numeral 201 represents a manufacturing factory of a manufacturing-apparatus user (a semiconductor-device maker). In the manufacturing line of the factory, manufacturing apparatuses for performing respective processes, i.e., in this case, exposure apparatuses 202, resist process apparatuses 203, and a film forming apparatus 204 are introduced. In FIG. 14, only one manufacturing factory 201 is illustrated. Actually, however, a plurality of factories are similarly subjected to network management. The respective apparatuses within the factory 201 are interconnected by a LAN 206 to construct an intranet, and operation management of the production line is performed by a host management system 205.

Business centers of respective vendors (apparatus supply makers), i.e., an exposure-apparatus maker 210, a resist-process-apparatus maker 220, a film-forming-apparatus maker 230, include host management systems 211, 221 and 231, respectively, for performing remote maintenance of supplied apparatuses. As described above, each of the host management systems 211, 221 and 231 includes a maintenance database and a gateway of an external network. The host management system 205 for managing respective apparatuses within the user's manufacturing factory and the management systems 211, 221 and 231 of the vendors of the respective apparatuses are interconnected by the Internet, serving as an external network 200, or a dedicated network. In this system, if at least of one of a series of manufacturing apparatuses of the production line is in trouble, the operation of the production line stops. However, it is possible to perform a prompt action by receiving remote maintenance from the vendor of the apparatus in trouble, via the Internet 200, and minimize interruption of the production line.

Each manufacturing apparatus installed in a semiconductor manufacturing factory includes a display, a network interface, software for network access stored in a storage device, and a computer for executing software for operating the apparatus. The storage device comprises an incorporated memory, a hard disk, a network file server, or the like. The software for network access includes a dedicated or general-purpose browser, and provides a user interface having, for example, a picture frame shown in FIG. 15, on the display. An operator for managing a manufacturing apparatus at each factory inputs information relating to the type 401 of the manufacturing apparatus, a serial number 402, a trouble item 403, the date of occurrence 404, the urgency 405, the symptom 406, the action 407, the progress 408, and the like in corresponding input items on the picture frame while referring to the picture frame. The input information is transmitted to the maintenance database via the Internet. Appropriate maintenance information corresponding to the transmitted information is transmitted from the maintenance database and is displayed on the display. As shown in FIG. 15, the user interface provided by the web browser realizes hyperlink functions 410–412, so that the operator can access further detailed information relating to each item, extract latest-version software to be used for the manufacturing apparatus from a software library provided by the vendor, and extract an operation guide (help information) to be referred to by the operator. The maintenance information provided by the maintenance database includes the above-described information relating to the present invention, and the software library also provides the latest software for realizing the present invention.

Figure 16:
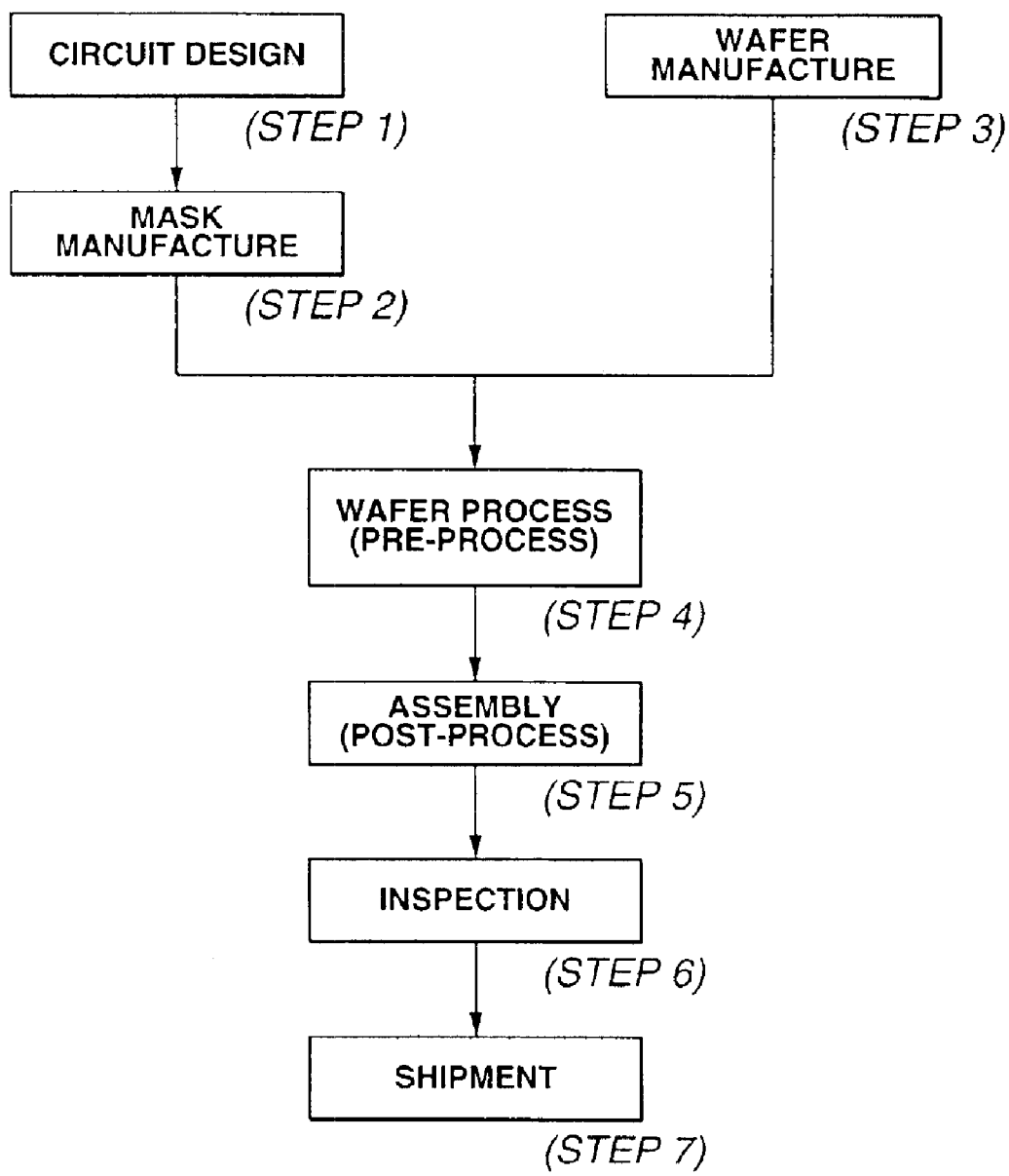
FIGS. 16 and 17 are diagrams illustrating the flow of a device manufacturing process.

Next, a description will be provided of a semiconductor-device manufacturing process utilizing the above-described production system. FIG. 16 illustrates the flow of the entirety of the manufacturing process. In step 1 (circuit design), circuit design of semiconductor devices is performed. In step 2 (mask manufacture), masks, on which designed circuit patterns are formed, are manufactured. In step 3 (wafer manufacture), wafers are manufactured using a material, such as silicon or the like. Step 4 (wafer process) is called a pre-process, in which actual circuits are formed on the wafers by means of photolithography using the above-described masks and wafers. Step 5 (assembly) is called a post-process which manufactures semiconductor chips using the wafers manufactured in step 4, and includes an assembling process (dicing and bonding), a packaging process (chip encapsulation), and the like. In step 6 (inspection), inspection operations, such as operation-confirming tests, durability tests, and the like, of the semiconductor devices manufactured in step 5 are performed. The manufacture of semiconductor devices is completed after passing through the above-described processes, and the manufactured devices are shipped (step 7). The pre-process and the post-process are performed at different dedicated factories, and maintenance is performed by the above-described remote maintenance system at each of the factories. Information for production management and apparatus maintenance is communicated between the pre-process factory and the post-process factory via the Internet or a dedicated network.

Figure 17:
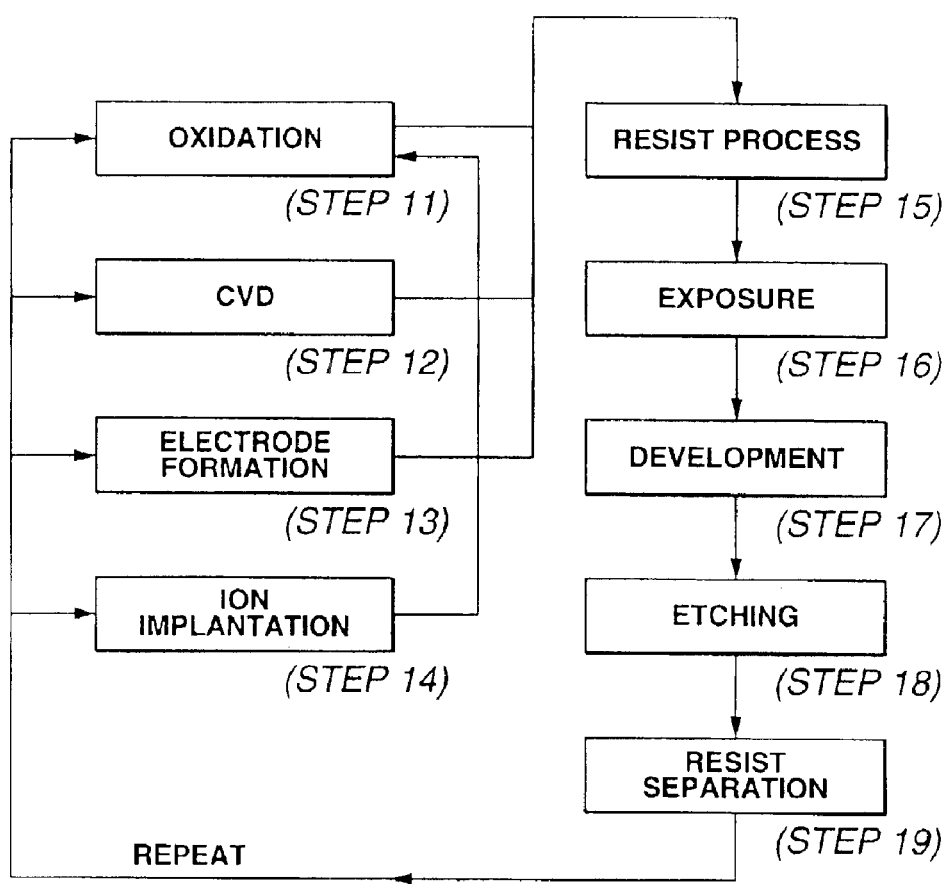

FIG. 17 is a detailed flow diagram of the above-described wafer process (i.e., step 4). In step 11 (oxidation), the surface of the wafer is oxidized. In step 12 (CVD (chemical vapor deposition)), an insulating film is formed on the surface of the wafer. In step 13 (electrode formation), electrodes are formed on the surface of the wafer by vacuum deposition. In step 14 (ion implantation), ions are implanted into the wafer. In step 15 (resist process), a photosensitive material is coated on the wafer. In step 16 (exposure), the circuit pattern on the mask is exposed and printed on the wafer using the above-described exposure apparatus. In step 17 (development), the exposed wafer is developed. In step 18 (etching), portions other than the developed resist image are etched off. In step 19 (resist separation), the resist, which becomes unnecessary after the completion of the etching, is removed. By repeating these steps, a final circuit pattern made of multiple patterns is formed on the wafer. Since manufacturing apparatuses used in the respective steps are maintained by the above-described remote maintenance system, it is possible to prevent troubles, promptly recover a trouble even if it occurs, and improve the productivity of semiconductor devices as compared with the conventional approach.

As shown in FIG. 8, the coil spring 28, serving as self-weight supporting means for the top plate, may, of course, also be used in the present invention. In this case, it is necessary to take into consideration of balance between the floating force of the top plate caused by the repulsive force of the magnet and the floating force by the spring 28.

Except as otherwise disclosed therein, the individual components shown in outline or designated by blocks in the drawings are all well known in the supporting apparatus and method, stage apparatus and exposure apparatus arts and their specific construction and operation are not critical to the operation or the best mode for carrying out the invention.

While the present invention has been described with respect to what are presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A supporting apparatus comprising:

a first movable member; and a supporting unit having a plurality of magnets whose same poles are arranged to face each other, said supporting unit being configured to support said movable member using a floating force generated by said plurality of magnets as a repulsive force in a floating direction perpendicular to a facing direction of said plurality of magnets, wherein, the direction of magnetization of said magnets and said facing direction are the same direction.

2. A supporting apparatus according to claim 1, wherein when said first movable member is set to a first position in the floating direction, an inclination of a tangent of a characteristic curve representing a relationship between the floating force and a displacement in the floating direction is negative.

3. A supporting apparatus according to claim 2, wherein when said first movable member is set to a second position different from the first position, the following condition is satisfied:

the floating force < a self-weight of said first movable member.

4. A supporting apparatus according to claim 3, wherein the second position is lower than the first position with respect to the floating direction.

5. A supporting apparatus according to claim 4, wherein the first position is a position at which said first movable member is disposed when predetermined processing is performed for an object to be processed upon said movable member, and wherein the second position is a position at which said first movable member is disposed when the object to be processed is delivered onto said first movable member.

6. A supporting apparatus according to claim 1, wherein said supporting unit comprises a repulsive movable member and a repulsive stator, wherein said repulsive movable member, at a side of said repulsive movable member facing said first movable member, comprises only a magnet, and wherein said repulsive stator comprises a yoke and a magnet disposed closer to said repulsive movable member than said yoke.

7. A supporting apparatus according to claim 1, wherein said supporting unit comprises (a) a stator including a magnet and (b) a second movable member in contact with the first movable member that includes a magnet insertable in the stator, and wherein when the floating direction is defined as a z-axis direction, a direction of a normal of a surface where the same poles of the plurality of magnets face each other is defined as a y-axis direction, and a direction orthogonal to a zy plane is defined as an x-axis direction, the following condition is satisfied:

the size in the x-axis direction of said magnet of said second movable member < the size in the x-axis direction of said magnet of said stator.

8. A supporting apparatus according to claim 1, wherein a plurality of said supporting members are provided.

9. A supporting apparatus according to claim 8, wherein a direction of magnetization of the magnet differs among said plurality of supporting members.

10. A supporting apparatus according to claim 1, wherein each of said plurality of magnets is made of a plate-shaped material that is magnetized in a direction of a thickness of said magnet.

11. A stage apparatus comprising:

a top plate on which an object to be positioned is mountable;

a supporting apparatus according to claim 1, said supporting apparatus being configured to support said top plate; and driving means for performing six-axes control of said top plate.

12. A stage apparatus according to claim 11, wherein said driving means comprises a fine-movement linear motor.

13. An exposure apparatus comprising a stage apparatus according to claim 12.

14. A semiconductor-device manufacturing method comprising the steps of:

installing, in a semiconductor manufacturing factory, a group of manufacturing apparatuses for performing semiconductor-device manufacturing processes, the group of manufacturing apparatuses including various processes including an exposure apparatus according to claim 13; and manufacturing semiconductor devices by performing a plurality of semiconductor-device manufacturing processes using the group of manufacturing apparatuses.

15. A semiconductor-device manufacturing method according to claim 14, further comprising the steps of:

interconnecting the group of manufacturing apparatuses by a local area network; and performing data communication of information relating to at least one of the group of manufacturing apparatuses between the local area network and an external network outside of the semiconductor manufacturing factory.

16. A semiconductor-device manufacturing method according to claim 15, wherein production management is performed (a) by obtaining maintenance information for the group of manufacturing apparatuses, said step of obtaining of maintenance information comprising using data communication via the external network to access a database provided by a vendor or a user of the exposure apparatus, or (b) by performing data communication via the external network with another semiconductor manufacturing factory.

17. A semiconductor manufacturing factory comprising:
a group of manufacturing apparatuses for performing a plurality of semiconductor manufacturing processes, said group of manufacturing apparatuses including an exposure apparatus according to claim 13;
a local area network configured to interconnect said group of manufacturing apparatuses; and
a gateway configured to allow access from said local area network to an external network outside of said semiconductor manufacturing factory,
wherein data communication of information relating to at least one of said group of manufacturing apparatuses is allowed in between said local area network and the external network outside of said semiconductor manufacturing factory via said gateway.

18. A maintenance method comprising the steps of:
providing a maintenance database connected to an external network outside of a semiconductor manufacturing factory by a vendor or a user of an exposure apparatus according to claim 13 installed in the semiconductor manufacturing factory;
allowing access to the maintenance database from within the semiconductor manufacturing factory via the external network; and
transmitting maintenance information stored in the maintenance database to the semiconductor manufacturing factory via the external network.

19. An exposure apparatus according to claim 13, further comprising:
a display;
a network interface; and
a computer adapted to execute software for a network;
wherein data communication of maintenance information of said exposure apparatus via a computer network is allowed by using said computer and said network interface.

20. An exposure apparatus according to claim 19, wherein the software for the network (a) provides a user interface on said display, the user interface being connected to an external network outside of a factory where said exposure apparatus is installed, the user interface further being configured to access a maintenance database provided by a vendor or a user of said exposure apparatus, and (b) obtains information from the maintenance database via the external network.

21. A supporting method comprising the steps of:
providing a first movable member;
providing a plurality of magnets whose same poles are arranged to face each other; and
supporting the first movable member using a floating force generated by the plurality of magnets as a repulsive force in a floating direction perpendicular to a facing direction of the plurality of magnets,
wherein the generated floating force is controlled according to a position of the first moving member in the floating direction.

22. An apparatus comprising:
a plate arranged to support a wafer, upon which wafer a semiconductor manufacturing process is to be performed;
a supporting device configured to support said plate, said supporting device comprising a movable magnet and a stator comprising a first stator magnet and a second stator magnet disposed on opposite sides of said movable magnet, each of said first stator magnet and said second stator magnet having a pole facing said movable magnet that is the same as the respective facing pole of said movable magnet.

23. An apparatus according to claim 22, wherein said stator further comprises a first yoke and a second yoke which together with said first stator magnet and said second stator magnet form a magnetic circuit.

24. An apparatus according to claim 22, wherein a plurality of said supporting devices are included.

25. An apparatus according to claim 22, wherein three of said supporting devices are included.

26. An apparatus according to claim 22, wherein said plate is supported by said supporting device by resting upon a magnet holder disposed between said movable magnet and said plate.

27. A stage apparatus comprising:
a top plate on which an object to be positioned is mountable;
a supporting unit having a plurality of magnets whose same poles are arranged to face each other, said supporting unit being configured to support said top plate using a floating force generated by said plurality of magnets as a repulsive force in a floating direction perpendicular to a facing direction of said plurality of magnets,
wherein the generated floating force is controlled according to a position of the top plate in the floating direction.

28. An apparatus according to claim 22, wherein the facing direction is perpendicular to the supporting direction.

* * * * *